US008688899B2

(12) United States Patent
Nellans et al.

(10) Patent No.: US 8,688,899 B2
(45) Date of Patent: Apr. 1, 2014

(54) APPARATUS, SYSTEM, AND METHOD FOR AN INTERFACE BETWEEN A MEMORY CONTROLLER AND A NON-VOLATILE MEMORY CONTROLLER USING A COMMAND PROTOCOL

(75) Inventors: David Nellans, Salt Lake City, UT (US); Robert Wipfel, Draper, UT (US)

(73) Assignee: Fusion-io, Inc., Salt Lake City, UT (US)

( * ) Notice: Subject to any disclaimer, the term of this patent is extended or adjusted under 35 U.S.C. 154(b) by 273 days.

(21) Appl. No.: 13/248,006

(22) Filed: Sep. 28, 2011

(65) Prior Publication Data

US 2012/0079174 A1    Mar. 29, 2012

Related U.S. Application Data

(60) Provisional application No. 61/387,400, filed on Sep. 28, 2010.

(51) Int. Cl.
*G06F 12/00* (2006.01)
*G06F 13/00* (2006.01)
*G06F 13/28* (2006.01)

(52) U.S. Cl.
USPC .......................................... 711/103; 711/154

(58) Field of Classification Search
USPC .................................................. 711/103, 154
See application file for complete search history.

(56) References Cited

U.S. PATENT DOCUMENTS

| 7,185,162 | B1 | 2/2007 | Snyder |
| 7,328,307 | B2 | 2/2008 | Hoogterp |
| 7,380,081 | B2 * | 5/2008 | Ji et al. ............................ 711/162 |
| 7,761,625 | B2 * | 7/2010 | Karamcheti et al. ............. 710/62 |
| 7,778,092 | B2 * | 8/2010 | Klein ........................ 365/189.05 |
| 2007/0260813 | A1 | 11/2007 | Lin |
| 2008/0162590 | A1 * | 7/2008 | Kundu et al. .................. 707/202 |
| 2010/0122017 | A1 | 5/2010 | Toyama |
| 2010/0199020 | A1 | 8/2010 | Lin et al. |

FOREIGN PATENT DOCUMENTS

WO    2012050934    4/2012

OTHER PUBLICATIONS

"Internet Backbone and Colocation Provider", Hurricane Electric Internet Services, downloaded Sep. 28, 2011, p. 1, http://www.he.net/.
Savov, Vlad, "Viking Modular's SATADIMM Jacks an SSD Into Your Memory Slot", Engadget, Aug. 27, 2010, pp. 6, http://www.engadget.com/2010/08/27/viking-modulars-satadimm-jacks-an-ssd-into-your.

(Continued)

*Primary Examiner* — Matthew Bradley
*Assistant Examiner* — Rocio Del Mar Perez-Velez
(74) *Attorney, Agent, or Firm* — Kunzler Law Group, PC

(57) ABSTRACT

Apparatuses, systems, and methods are presented for a direct interface between a memory controller and a non-volatile memory controller using a command protocol. A method includes receiving a command from a memory controller to a non-volatile memory controller over a wire interface by way of a command protocol. The memory controller is coupled to one or more processors and the non-volatile memory controller, in one embodiment, is coupled to non-volatile memory media. The command protocol includes a control path that enables the memory controller to distinguish among different memory modules. A method includes executing the command within the non-volatile memory controller in response to determining that the non-volatile memory controller is capable of satisfying the command.

20 Claims, 14 Drawing Sheets

(56) References Cited

OTHER PUBLICATIONS

Wu, Michael, "eNVy: A Non-Volatile, Main Memory Storage System", ACM, 1994, pp. 12, 0-89791-660-3/94/0010, San Jose, California, US.

Application No. PCT/US2011/053792, International Search Report and Written Opinion, May 4, 2012.
Application No. PCT/US2011/053792, International Preliminary Report on Patentability, Apr. 11, 2013.

* cited by examiner

APPARATUS, SYSTEM, AND METHOD FOR AN INTERFACE BETWEEN A MEMORY CONTROLLER AND A NON-VOLATILE MEMORY CONTROLLER USING A COMMAND PROTOCOL

CROSS-REFERENCES TO RELATED APPLICATIONS

This application claims priority to U.S. Provisional Patent Application Number 61/387,400 entitled "APPARATUS, SYSTEM, AND METHOD FOR A DIRECT INTERFACE BETWEEN A MEMORY CONTROLLER AND NON-VOLATILE MEMORY" and filed on Sep. 28, 2010 for David Nellans, et al., which is incorporated herein by reference.

BACKGROUND

1. Field

This application relates to an interface between a processor memory controller and a non-volatile memory controller and more particular relates to a direct interface between a memory controller and a non-volatile memory controller using a command protocol.

2. Description of the Related Art

In typical computing devices, main memory includes volatile memory such as dynamic random access memory ("DRAM") and static random access memory ("SRAM"). A processor typically communicates with the main memory over a wire interface using a low-level wire protocol such as the Joint Electron Devices Engineering Council ("JEDEC") protocol, the industry standard for processor—DRAM interfaces. The JEDEC standard assumes that physically addressable media is synchronous, heavily parallel, reliable and implements a design structure that is known to a processor memory controller. Consequently, JEDEC uses a series of distinct commands that cause the DRAM devices to execute known operations in hardware.

Recent significant development of flash-based devices enable use of non-volatile memory as a main memory replacement. However, typical non-volatile main memory solutions continue to provide communication between the processor and the non-volatile main memory using a low-level wire protocol such as JEDEC.

BRIEF SUMMARY

Methods are presented for an interface between a memory controller and a non-volatile memory controller using a command protocol. In one embodiment, the method includes receiving a command from a memory controller to a non-volatile memory controller over a wire interface by way of a command protocol. The memory controller, in one embodiment, is coupled to one or more processors and the non-volatile memory controller, in one embodiment, is coupled to non-volatile memory media. The command protocol, in one embodiment, includes a control path that enables the memory controller to distinguish among different memory modules. In one embodiment, the method includes executing the command within the non- volatile memory controller in response to determining that the non-volatile memory controller is capable of satisfying the command.

Apparatuses are presented for an interface between a memory controller and a non-volatile memory controller using a command protocol. In one embodiment, a receiving module is configured to receive a command from a memory controller to a non-volatile memory controller over a wire interface by way of a command protocol. The memory controller, in one embodiment, is coupled to one or more processors. The non-volatile memory controller, in one embodiment, is coupled to non-volatile memory media. The command protocol, in one embodiment, includes a control path that enables the memory controller to distinguish among different memory modules. The non-volatile memory controller, in one embodiment, stores data sequentially on the non-volatile memory media to preserve an ordered sequence of memory operations performed on the non-volatile memory media. In one embodiment, an execution module is configured to execute the command within the non-volatile memory controller in response to determining that the non-volatile memory controller is capable of satisfying the command.

A system is presented for an interface between a memory controller and a non-volatile memory controller using a command protocol. The system, in one embodiment, is embodied by one or more processors, a memory controller coupled to the one or more processors, and a non-volatile memory controller coupled to non-volatile memory media. The memory controller, in one embodiment, is configured to generate a command in response to a request from a client. In one embodiment, the memory controller is configured to communicate the command over a wire interface by way of a command protocol. In one embodiment, the command protocol includes a control path that enables the memory controller to distinguish among different memory modules. In one embodiment, the non-volatile memory controller is configured to receive the command from the memory controller and to store data sequentially on the non-volatile memory media to preserve an ordered sequence of memory operations performed on the non-volatile memory media. In one embodiment, the non-volatile memory controller is configured to execute the command within the non-volatile memory controller in response to determining that the non-volatile memory controller is capable of satisfying the command.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
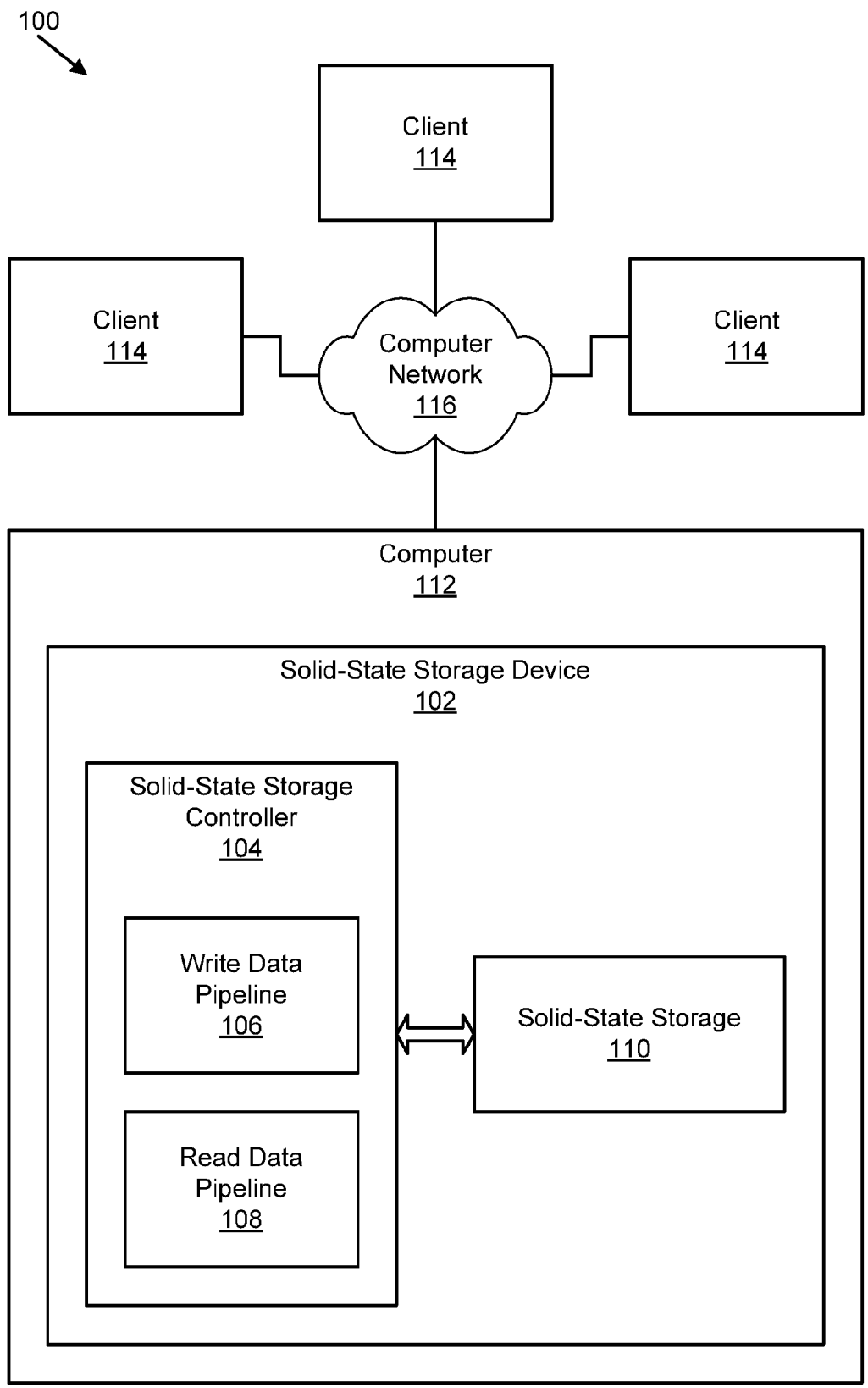
FIG. 1 is a schematic block diagram illustrating one embodiment of a solid-state storage system in accordance with the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of computer readable program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of computer readable program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the computer readable program code may be stored and/or propagated on or in one or more computer readable medium(s).

The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store computer readable program code for use by and/or in connection with an instruction execution system, apparatus, or device.

The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport computer readable program code for use by or in connection with an instruction execution system, apparatus, or device. Computer readable program code embodied on a computer readable signal medium may be transmitted using any appropriate medium, including but not limited to wireless, wireline, optical fiber cable, Radio Frequency (RF), or the like, or any suitable combination of the foregoing. In one embodiment, the computer readable medium may comprise a combination of one or more computer readable storage mediums and one or more computer readable signal mediums. For example, computer readable program code may be both propagated as an electro-magnetic signal through a fiber optic cable for execution by a processor and stored on RAM storage device for execution by the processor.

Computer readable program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The computer readable program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by computer readable program code. These computer readable program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The computer readable program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The computer readable program code may also be loaded onto a computer, other programmable data processing apparatus, or other devices to cause a series of operational steps to be performed on the computer, other programmable apparatus or other devices to produce a computer implemented process such that the program code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer readable program code.

Solid-State Storage System

FIG. 1 is a schematic block diagram illustrating one embodiment of a system 100 for improving performance in a solid-state storage device in accordance with the present invention. The system 100 includes a solid-state storage device 102, a solid-state storage controller 104, a write data pipeline 106, a read data pipeline 108, a solid-state storage 110, a computer 112, a client 114, and a computer network 116, which are described below.

The system 100 includes at least one solid-state storage device 102. In another embodiment, the system 100 includes two or more solid-state storage devices 102. Each solid-state storage device 102 may include non-volatile, solid-state storage 110, such as flash memory, nano random access memory ("nano RAM or NRAM"), magneto-resistive RAM ("MRAM"), dynamic RAM ("DRAM"), phase change RAM ("PRAM"), etc. In further embodiments, the data storage device 102 may include other types of non-volatile and/or volatile data storage, such as dynamic RAM ("DRAM"), static RAM ("SRAM"), magnetic data storage, optical data storage, and/or other data storage technologies.

Figure 2:
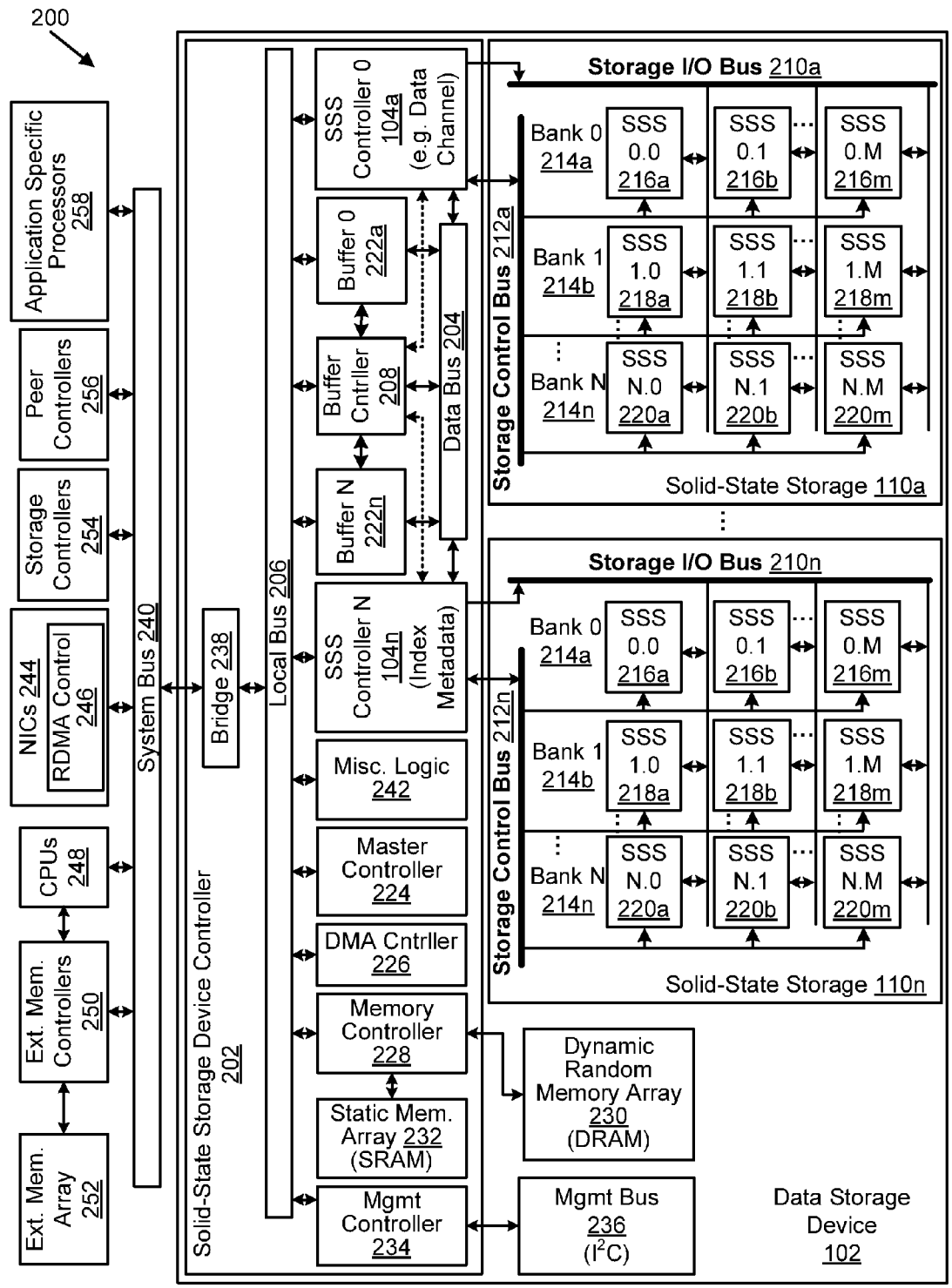
FIG. 2 is a schematic block diagram illustrating one embodiment of a solid-state storage device controller in solid-state storage device in accordance with the present invention.
Figure 3:
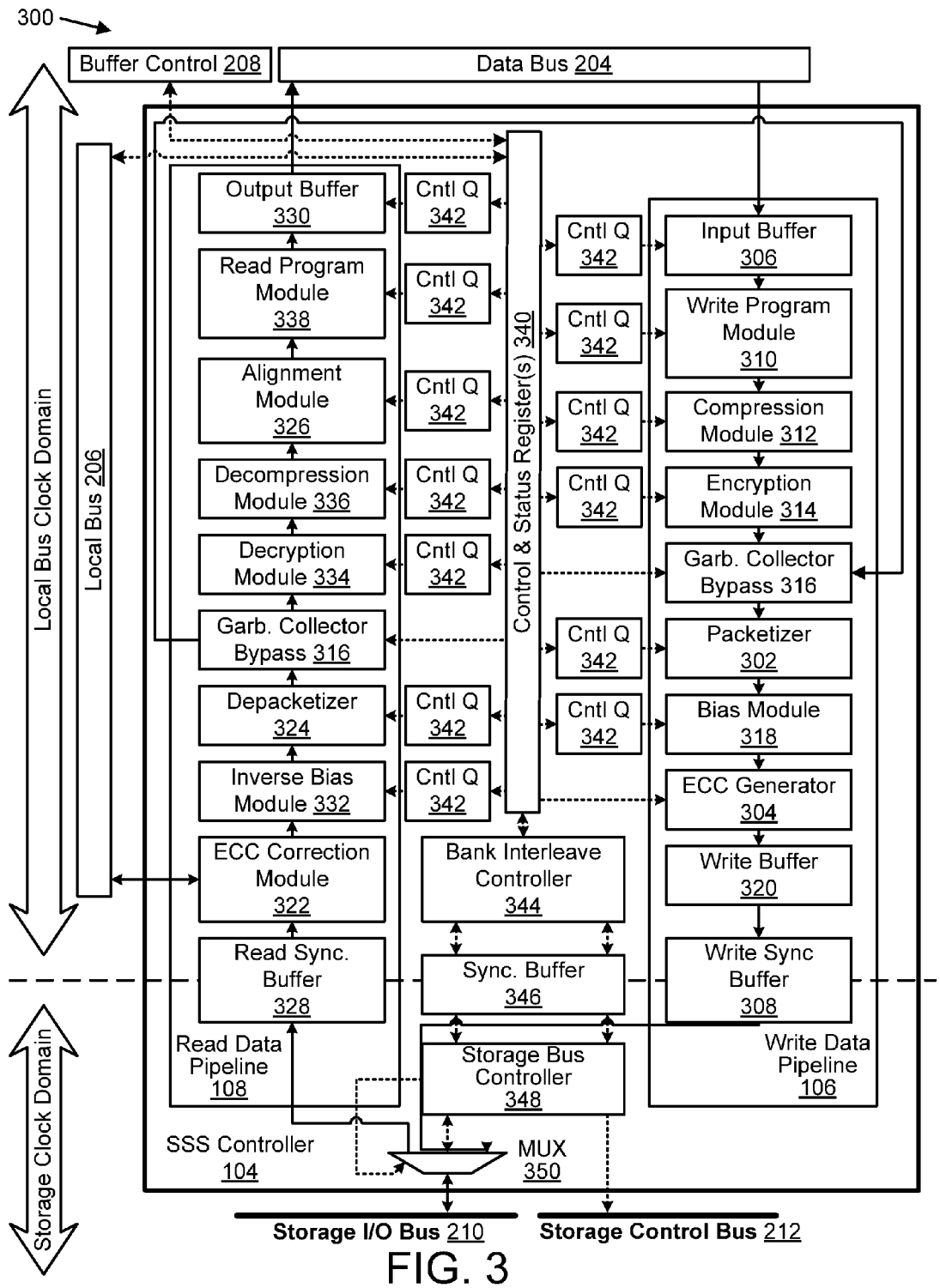
FIG. 3 is a schematic block diagram illustrating one embodiment of a solid-state storage controller with a write data pipeline and a read data pipeline in a solid-state storage device in accordance with the present invention.

The solid-state storage device 102 is described in more detail with respect to FIGS. 2 and 3. The solid-state storage device 102 is depicted in a computer 112 connected to a client 114 through a computer network 116. In one embodiment, the solid-state storage device 102 is internal to the computer 112 and is connected using a system bus, such as a peripheral component interconnect express ("PCI-e") bus, a Serial Advanced Technology Attachment ("serial ATA") bus, or the like. In another embodiment, the solid-state storage device 102 is external to the computer 112 and is connected, a universal serial bus ("USB") connection, an Institute of Electrical and Electronics Engineers ("IEEE") 1394 bus ("FireWire"), or the like. In other embodiments, the solid-state storage device 102 is connected to the computer 112 using a peripheral component interconnect ("PCI") express bus using external electrical or optical bus extension or bus networking solution such as Infiniband or PCI Express Advanced Switching ("PCIe-AS"), or the like.

In various embodiments, the solid-state storage device 102 may be in the form of a dual-inline memory module ("DIMM"), a daughter card, or a micro-module. In another embodiment, the solid-state storage device 102 is an element within a rack-mounted blade. In another embodiment, the solid-state storage device 102 is contained within a package that is integrated directly onto a higher level assembly (e.g. mother board, lap top, graphics processor). In another embodiment, individual components comprising the solid-state storage device 102 are integrated directly onto a higher level assembly without intermediate packaging.

The solid-state storage device 102 includes one or more solid-state storage controllers 104, each may include a write data pipeline 106 and a read data pipeline 108 and each includes a solid-state storage 110, which are described in more detail below with respect to FIGS. 2 and 3.

The system 100 includes one or more computers 112 connected to the solid-state storage device 102. A computer 112 may be a host, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer 112 may be a client and the solid-state storage device 102 operates autonomously to service data requests sent from the computer 112. In this embodiment, the computer 112 and solid-state storage device 102 may be connected using a computer network, system bus, Direct Attached Storage (DAS) or other communication means suitable for connection between a computer 112 and an autonomous solid-state storage device 102.

In one embodiment, the system 100 includes one or more clients 114 connected to one or more computer 112 through one or more computer networks 116. A client 114 may be a host, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network 116 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network 116 may also include a network from the IEEE 802 family of network technologies, such Ethernet, token ring, WiFi, WiMax, and the like.

In a further embodiment, instead of being connected directly to the computer 112 as DAS, the data storage device 102 may be connected to the computer 112 over a data network. For example, the data storage device 102 may include a storage area network ("SAN") storage device, a network attached storage ("NAS") device, a network share, or the like. In one embodiment, the system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the computer 112 and the data storage device 102.

The computer network 116 may include servers, switches, routers, cabling, radios, and other equipment used to facilitate networking computers 112 and clients 114. In one embodiment, the system 100 includes multiple computers 112 that communicate as peers over a computer network 116. In another embodiment, the system 100 includes multiple solid-state storage devices 102 that communicate as peers over a computer network 116. One of skill in the art will recognize other computer networks 116 comprising one or more computer networks 116 and related equipment with single or redundant connection between one or more clients 114 or other computer with one or more solid-state storage devices 102 or one or more solid-state storage devices 102 connected to one or more computers 112. In one embodiment, the system 100 includes two or more solid-state storage devices 102 connected through the computer network 116 to a client 114 without a computer 112.

In one embodiment, the data storage device 102 has a block device interface that support block device commands. For example, the first data storage device 102 may support the ATA interface standard, the ATA Packet Interface ("ATAPI") standard, the small computer system interface ("SCSI") standard, and/or the Fibre Channel standard which are maintained by the InterNational Committee for Information Technology Standards ("INCITS").

Solid-State Storage Device

FIG. 2 is a schematic block diagram illustrating one embodiment 200 of a solid-state storage device controller 202 that includes a write data pipeline 106 and a read data pipeline 108 in a solid-state storage device 102 in accordance with the present invention. The solid-state storage device controller 202 may be embodied as hardware, as software, or as a combination of hardware and software. The solid-state storage device controller 202 may include a number of solid-state storage controllers 0-N 104a-n, each controlling solid-state storage media 110. In the depicted embodiment, two solid-state controllers are shown: solid-state controller 0 104a and solid-state storage controller N 104n, and each controls solid-state storage media 110a-n. In the depicted embodiment, solid-state storage controller 0 104a controls a data channel so that the attached solid-state storage media 110a stores data. Solid-state storage controller N 104n controls an index metadata channel associated with the stored data and the associated solid-state storage media 110n stores index metadata. In an alternate embodiment, the solid-state storage device controller 202 includes a single solid-state controller 104a with a single solid-state storage media 110a. In another embodiment, there are a plurality of solid-state storage controllers 104a-n and associated solid-state storage media 110a-n. In one embodiment, one or more solid-state controllers 104a-104n-1, coupled to their associated solid-state storage media 110a-110n-1, control data while at least one solid-state storage controller 104n, coupled to its associated solid-state storage media 110n, controls index metadata.

In one embodiment, at least one solid-state controller 104 is field-programmable gate array ("FPGA") and controller functions are programmed into the FPGA. In a particular embodiment, the FPGA is a Xilinx® FPGA. In another embodiment, the solid-state storage controller 104 comprises components specifically designed as a solid-state storage controller 104, such as an application-specific integrated circuit ("ASIC") or custom logic solution. Each solid-state storage controller 104 typically includes a write data pipeline 106 and a read data pipeline 108, which are describe further in relation to FIG. 3. In another embodiment, at least one solid-state storage controller 104 is made up of a combination FPGA, ASIC, and custom logic components.

Solid-State Storage

The solid-state storage media 110 is an array of non-volatile solid-state storage elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the solid-state storage media 110, data cannot be read from the solid-state storage media 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A solid-state storage element (e.g. SSS 0.0 216a) is typically configured as a chip (a package of one or more dies) or a die on a circuit board. As depicted, a solid-state storage element (e.g. 216a) operates independently or semi-independently of other solid-state storage elements (e.g. 218a) even if these several elements are packaged together in a chip package, a stack of chip packages, or some other package element. As depicted, a row of solid-state storage elements 216a, 216b, 216m is designated as a bank 214. As depicted, there may be "n" banks 214a-n and "m" solid-state storage elements 216a-m, 218a-m, 220a-m per bank in an array of n×m solid-state storage elements 216, 218, 220 in a solid-state storage media 110. Of course different embodiments may include different values for n and m. In one embodiment, the solid-state storage media 110a includes twenty solid-state storage elements 216, 218, 220 per bank 214 with eight banks 214. In one embodiment, the solid-state storage media 110a includes twenty four solid-state storage elements 216, 218, 220 per bank 214 with eight banks 214. In addition to the n×m storage elements 216, 218, 220, one or more additional columns (P) may also be addressed and operated in parallel with other solid-state storage elements 216a, 216b, 216m for one or more rows. The added P columns in one embodiment, store parity data for the portions of an ECC chunk (i.e. an ECC codeword) that span m storage elements for a particular bank. In one embodiment, each solid-state storage element 216, 218, 220 is comprised of single-level cell ("SLC") devices. In another embodiment, each solid-state storage element 216, 218, 220 is comprised of multi-level cell ("MLC") devices.

In one embodiment, solid-state storage elements that share a common storage I/O bus 210a (e.g. 216b, 218b, 220b) are packaged together. In one embodiment, a solid-state storage element 216, 218, 220 may have one or more dies per chip with one or more chips stacked vertically and each die may be accessed independently. In another embodiment, a solid-state storage element (e.g. SSS 0.0 216a) may have one or more virtual dies per die and one or more dies per chip and one or more chips stacked vertically and each virtual die may be accessed independently. In another embodiment, a solid-state storage element SSS 0.0 216a may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. SSS 0.0-SSS 8.0) 216a-220a, each in a separate bank 214a-n. In another embodiment, 24 storage elements (e.g. SSS 0.0-SSS 0.24) 216 form a logical bank 214a so that each of the eight logical banks has 24 storage elements (e.g. SSS0.0-SSS 8.24) 216, 218, 220. Data is sent to the solid-state storage media 110 over the storage I/O bus 210 to all storage elements of a particular group of storage elements (SSS 0.0-SSS 8.0) 216a, 218a, 220a. The storage control bus 212a is used to select a particular bank (e.g. Bank 0 214a) so that the data received over the storage I/O bus 210 connected to all banks 214 is written just to the selected bank 214a.

In a one embodiment, the storage I/O bus 210 is comprised of one or more independent I/O buses ("IIOBa-m" comprising 210a.a-m, 210n.a-m) wherein the solid-state storage elements within each column share one of the independent I/O buses that accesses each solid-state storage element 216, 218, 220 in parallel so that all banks 214 are accessed simultaneously. For example, one channel of the storage I/O bus 210 may access a first solid-state storage element 216a, 218a, 220a of each bank 214a-n simultaneously. A second channel of the storage I/O bus 210 may access a second solid-state storage element 216b, 218b, 220b of each bank 214a-n simultaneously. Each row of solid-state storage element 216a, 216b, 216m is accessed simultaneously. In one embodiment, where solid-state storage elements 216, 218, 220 are multi-level (physically stacked), all physical levels of the solid-state storage elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level solid-state storage element 216, 218, 220. In other embodiments, other commands are used by the storage control bus 212 to individually select one level of a multi-level solid-state storage element 216, 218, 220. Solid-state storage elements 216, 218, 220 may also be selected through a combination of control and of address information transmitted on storage I/O bus 210 and the storage control bus 212.

In one embodiment, each solid-state storage element 216, 218, 220 is partitioned into erase blocks and each erase block is partitioned into pages. An erase block on a solid-state storage element 216, 218 220 may be called a physical erase block or "PEB." A typical page is 2000 bytes ("2 kB"). In one example, a solid-state storage element (e.g. SSS 0.0) includes two registers and can program two pages so that a two-register solid-state storage element 216, 218, 220 has a capacity of 4 kB. A bank 214 of 20 solid-state storage elements 216a, 216b, 216m would then have an 80 kB capacity of pages accessed with the same address going out the channels of the storage I/O bus 210.

This group of pages in a bank 214 of solid-state storage elements 216a, 216b, 216m of 80 kB may be called a logical page or virtual page. Similarly, an erase block of each storage element 216a-m of a bank 214a may be grouped to form a logical erase block or a virtual erase block. In one embodiment, an erase block of pages within a solid-state storage element 216, 218, 220 is erased when an erase command is received within a solid-state storage element 216, 218, 220. Whereas the size and number of erase blocks, pages, planes, or other logical and physical divisions within a solid-state storage element 216, 218, 220 are expected to change over time with advancements in technology, it is to be expected that many embodiments consistent with new configurations are possible and are consistent with the general description herein.

Typically, when a packet is written to a particular location within a solid-state storage element 216, 218, 220, wherein the packet is intended to be written to a location within a particular page which is specific to a particular physical erase block of a particular storage element of a particular bank, a physical address is sent on the storage I/O bus 210 and followed by the packet. The physical address contains enough information for the solid-state storage element 216, 218, 220 to direct the packet to the designated location within the page. Since all storage elements in a column of storage elements (e.g. SSS 0.0-SSS N.0 216a, 218a, 220a) are accessed simultaneously by the appropriate bus within the storage I/O bus 210a.a, to reach the proper page and to avoid writing the data packet to similarly addressed pages in the column of storage elements (SSS 0.0-SSS N.0 216a, 218a, 220a), the bank 214a that includes the solid-state storage element SSS 0.0 216a with the correct page where the data packet is to be written is simultaneously selected by the storage control bus 212.

Similarly, satisfying a read command on the storage I/O bus 210 requires a simultaneous signal on the storage control bus 212 to select a single bank 214a and the appropriate page within that bank 214a. In one embodiment, a read command reads an entire page, and because there are multiple solid-state storage elements 216a, 216b, 216m in parallel in a bank 214, an entire logical page is read with a read command. However, the read command may be broken into subcommands, as will be explained below with respect to bank interleave. A logical page may also be accessed in a write operation.

An erase block erase command may be sent out to erase an erase block over the storage I/O bus 210 with a particular erase block address to erase a particular erase block. Typically, an erase block erase command may be sent over the parallel paths of the storage I/O bus 210 to erase a logical erase block, each with a particular erase block address to erase a particular erase block. Simultaneously a particular bank (e.g. Bank 0 214a) is selected over the storage control bus 212 to prevent erasure of similarly addressed erase blocks in all of the banks (Banks 1-N 214b-n). Alternatively, no particular bank (e.g. Bank 0 214a) is selected over the storage control bus 212 to enable erasure of similarly addressed erase blocks in all of the banks (Banks 1-N 214b-n) simultaneously. Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the solid-state storage media 110. For example, packets are streamed to the storage write buffers of a bank 214a of storage elements 216 and when the buffers are full, the packets are programmed to a designated logical page. Packets then refill the storage write buffers and, when full, the packets are written to the next logical page. The next logical page may be in the same bank 214a or another bank (e.g. 214b). This process continues, logical page after logical page, typically until a logical erase block is filled. In another embodiment, the streaming may continue across logical erase block boundaries with the process continuing, logical erase block after logical erase block.

In a read, modify, write operation, data packets associated with requested data are located and read in a read operation. Data segments of the modified requested data that have been modified are not written to the location from which they are read. Instead, the modified data segments are again converted to data packets and then written sequentially to the next available location in the logical page currently being written. The index entries for the respective data packets are modified to point to the packets that contain the modified data segments. The entry or entries in the index for data packets associated with the same requested data that have not been modified will include pointers to original location of the unmodified data packets. Thus, if the original requested data is maintained, for example to maintain a previous version of the requested data, the original requested data will have pointers in the index to all data packets as originally written. The new requested data will have pointers in the index to some of the original data packets and pointers to the modified data packets in the logical page that is currently being written.

In a copy operation, the index includes an entry for the original requested data mapped to a number of packets stored in the solid-state storage media 110. When a copy is made, new copy of the requested data is created and a new entry is created in the index mapping the new copy of the requested data to the original packets. The new copy of the requested data is also written to the solid-state storage media 110 with its location mapped to the new entry in the index. The new copy of the requested data packets may be used to identify the packets within the original requested data that are referenced in case changes have been made in the original requested data that have not been propagated to the copy of the requested data and the index is lost or corrupted.

Beneficially, sequentially writing packets facilitates a more even use of the solid-state storage media 110 and allows the solid-storage device controller 202 to monitor storage hot spots and level usage of the various logical pages in the solid-state storage media 110. Sequentially writing packets also facilitates a powerful, efficient garbage collection system, which is described in detail below. One of skill in the art will recognize other benefits of sequential storage of data packets.

Solid-State Storage Device Controller

In various embodiments, the solid-state storage device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computer 112 or may be other devices.

Typically the solid-state storage controller(s) 104 communicate data to the solid-state storage media 110 over a storage I/O bus 210. In a typical embodiment where the solid-state storage is arranged in banks 214 and each bank 214 includes multiple storage elements 216a, 216b, 216m accessed in parallel, the storage I/O bus 210 is an array of busses, one for each column of storage elements 216, 218, 220 spanning the banks 214. As used herein, the term "storage I/O bus" may refer to one storage I/O bus 210 or an array of data independent busses 204. In one embodiment, each storage I/O bus 210 accessing a column of storage elements (e.g. 216a, 218a, 220a) may include a logical-to-physical mapping for storage divisions (e.g. erase blocks) accessed in a column of storage elements 216a, 218a, 220a. This mapping (or bad block remapping) allows a logical address mapped to a physical address of a storage division to be remapped to a different storage division if the first storage division fails, partially fails, is inaccessible, or has some other problem.

Data may also be communicated to the solid-state storage controller(s) 104 from a requesting device 155 through the system bus 240, bridge 238, local bus 206, buffer(s) 222, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a solid-state controller 104, and on to the solid-state storage media 110 such as NAND flash or other storage media. In one embodiment, data and associated out-of-band metadata ("metadata") arriving with the data is communicated using one or more data channels comprising one or more solid-state storage controllers 104a-104n-1 and associated solid-state storage media 110a-110n-1 while at least one channel (solid-state storage controller 104n, solid-state storage media 110n) is dedicated to in-band metadata, such as index information and other metadata generated internally to the solid-state storage device 102.

The local bus 206 is typically a bidirectional bus or set of busses that allows for communication of data and commands between devices internal to the solid-state storage device controller 202 and between devices internal to the solid-state storage device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a computer 112 or other device in which the solid-state storage device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The solid-state storage device 102 may be packaged to fit internally to a device or as an externally connected device.

The solid-state storage device controller 202 includes a master controller 224 that controls higher-level functions within the solid-state storage device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller 224.

In one embodiment, where the storage device/solid-state storage device controller 202 manages multiple data storage devices/solid-state storage media 110a-n, the master controller 224 divides the work load among internal controllers, such as the solid-state storage controllers 104a-n. For example, the master controller 224 may divide an object to be written to the data storage devices (e.g. solid-state storage media 110a-n) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a computer 112 or other device connected to the storage device/solid-state storage device 102 views the storage device/solid-state storage device 102 as a block storage device and sends data to specific physical addresses in the storage device/solid-state storage device 102. The master controller 224 then divides up the blocks and stores the data blocks as it would objects. The master controller 224 then maps the blocks and physical address sent with the block to the actual locations determined by the master controller 224. The mapping is stored in the object index. Typically, for block emulation, a block device application program interface ("API") is provided in a driver in the computer 112, client 114, or other device wishing to use the storage device/solid-state storage device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a client 114 may have access to the computer network 116 through an I/O memory driver using a standard stack API and operating in conjunction with NICs 244.

In one embodiment, the master controller 224 is also a redundant array of independent drive ("RAID") controller. Where the data storage device/solid-state storage device 102 is networked with one or more other data storage devices/solid-state storage devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element. In another embodiment, the master controller 224 may comprise many RAID, distributed RAID, and other functions as described elsewhere. In one embodiment, the master controller 224 controls storage of data in a RAID-like structure where parity information is stored in one or more storage elements 216, 218, 220 of a logical page where the parity information protects data stored in the other storage elements 216, 218, 220 of the same logical page.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 116) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/solid-state storage device 102 may appear as a storage device connected through a SCSI bus, Internet SCSI ("iSCSI"), fiber channel, etc. Meanwhile the storage device/solid-state storage device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/solid-state storage device 102 to be partitioned into multiple virtual devices and allows partition-based media encryption. In yet another embodiment, the master controller 224 supports a solid-state storage controller 104 with advanced, multi-bit ECC correction. One of skill in the art will recognize other features and functions of a master controller 224 in a storage controller 202, or more specifically in a solid-state storage device 102.

In one embodiment, the solid-state storage device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the object index is stored in memory 230, 232 and then periodically off-loaded to a channel of the solid-state storage media 110n or other non-volatile memory. One of skill in the art will recognize other uses and configurations of the memory controller 228, dynamic memory array 230, and static memory array 232.

In one embodiment, the solid-state storage device controller 202 includes a DMA controller 226 that controls DMA operations between the storage device/solid-state storage device 102 and one or more external memory controllers 250 and associated external memory arrays 252 and CPUs 248. Note that the external memory controllers 250 and external memory arrays 252 are called external because they are external to the storage device/solid-state storage device 102. In addition the DMA controller 226 may also control RDMA operations with requesting devices through a NIC 244 and associated RDMA controller 246.

In one embodiment, the solid-state storage device controller 202 includes a management controller 234 connected to a management bus 236. Typically the management controller 234 manages environmental metrics and status of the storage device/solid-state storage device 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically the management bus 236 is connected to the various components within the storage device/solid-state storage device 102. The management controller 234 may communicate alerts, interrupts, etc. over the local bus 206 or may include a separate connection to a system bus 240 or other bus. In one embodiment the management bus 236 is an Inter-Integrated Circuit ("I2C") bus. One of skill in the art will recognize other related functions and uses of a management controller 234 connected to components of the storage device/solid-state storage device 102 by a management bus 236.

In one embodiment, the solid-state storage device controller 202 includes miscellaneous logic 242 that may be customized for a specific application. Typically where the solid-state device controller 202 or master controller 224 is/are configured using a FPGA or other configurable controller, custom logic may be included based on a particular application, customer requirement, storage requirement, etc.

Data Pipeline

FIG. 3 is a schematic block diagram illustrating one embodiment 300 of a solid-state storage controller 104 with a write data pipeline 106 and a read data pipeline 108 in a solid-state storage device 102 in accordance with the present invention. The embodiment 300 includes a data bus 204, a local bus 206, and buffer control 208, which are substantially similar to those described in relation to the solid-state storage device controller 202 of FIG. 2. The write data pipeline 106 includes a packetizer 302 and an error-correcting code ("ECC") generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a bias module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include an inverse bias module 332, a portion of the garbage collector bypass 316, a decryption module 334, a decompression module 336, and a read program module 338. The solid-state storage controller 104 may also include control and status registers 340 and control queues 342, a bank interleave controller 344, a synchronization buffer 346, a storage bus controller 348, and a multiplexer ("MUX") 350. The components of the solid-state controller 104 and associated write data pipeline 106 and read data pipeline 108 are described below. In other embodiments, synchronous solid-state storage 110 may be used and synchronization buffers 308 328 may be eliminated.

Write Data Pipeline

The write data pipeline 106 includes a packetizer 302 that receives a data or metadata segment to be written to the solid-state storage, either directly or indirectly through another write data pipeline 106 stage, and creates one or more packets sized for the solid-state storage 110. The data or metadata segment is typically part of an object, but may also include an entire object. In another embodiment, the data segment is part of a block of data, but may also include an entire block of data. Typically, a set of data such as an object is received from a computer 112, client 114, or other computer or device and is transmitted to the solid-state storage device 102 in data segments streamed to the solid-state storage device 102 or computer 112. A data segment may also be known by another name, such as data parcel, but as referenced herein includes all or a portion of an object or data block.

Each object is stored as one or more packets. Each object may have one or more container packets. Each packet contains a header. The header may include a header type field. Type fields may include data, object attribute, metadata, data segment delimiters (multi-packet), object structures, object linkages, and the like. The header may also include information regarding the size of the packet, such as the number of bytes of data included in the packet. The length of the packet may be established by the packet type. The header may include information that establishes the relationship of the packet to the object. An example might be the use of an offset in a data packet header to identify the location of the data segment within the object. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the object to which the packet belongs. For example, the header may include an object identifier and offset that indicates the data segment, object, or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the object when reconstructing the data segment or object. The header may include a header type field. Type fields may include data, object attributes, metadata, data segment delimiters (multi-packet), object structures, object linkages, and the like. One of skill in the art will recognize other information that may be included in a header added to data or metadata by a packetizer 302 and other information that may be added to a packet.

The write data pipeline 106 includes an ECC generator 304 that that generates one or more error-correcting codes ("ECC") for the one or more packets received from the packetizer 302. The ECC generator 304 typically uses an error correcting algorithm to generate ECC check bits which are stored with the one or more data packets. The ECC codes generated by the ECC generator 304 together with the one or more data packets associated with the ECC codes comprise an ECC chunk. The ECC data stored with the one or more data packets is used to detect and to correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the algorithm which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the solid-state storage 110 to be extended. For example, if flash memory is used as the storage medium in the solid-state storage 110, the flash memory may be written approximately 100,000 times without error per erase cycle. This usage limit may be extended using a robust ECC algorithm. Having the ECC generator 304 and corresponding ECC correction module 322 onboard the solid-state storage device 102, the solid-state storage device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the solid-state storage device 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the solid-state storage 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the solid-state storage device 102 but outside the write data pipeline 106, in the computer 112, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the solid-state storage 110. The write synch buffer 308 is located at a boundary between a local clock domain and a solid-state storage clock domain and provides buffering to account for the clock domain differences. In other embodiments, synchronous solid-state storage 110 may be used and synchronization buffers 308 328 may be eliminated.

In one embodiment, the write data pipeline 106 also includes a bias module 318 that receives the one or more packets from the packetizer 302, either directly or indirectly. The bias module 318 biases the bits of the data packets toward a bias of storage cells of the solid-state storage 110. As used herein, a "bias" is a preference, probability, or tendency of values for bits within a set of bits to exhibit a specific data pattern. A bias may be a natural property, a designed attribute, or a random occurrence. Data itself may have a bias, and data storage media may have a bias. A bias may be toward binary ones, toward binary zeroes, toward a balance of binary ones and zeroes, toward a certain binary value for certain bits, or the like.

For example, in one embodiment, end sections of data files may be padded with binary zeroes, causing the data packets that store the end sections to exhibit a bias toward binary zeroes, meaning that the data packets have more binary zeroes than binary ones. Other data packets may have more binary ones than zeroes, or a balance of binary ones and zeroes. While data packets may each have an individual bias based on data within the packets, a bias of the storage cells of the solid-state storage 110 may be based on some benefit associated with the storage of a particular binary value or pattern, or some property of the storage cells. One example of a storage cell property, NAND flash storage cells presently are biased to all binary one values or almost all binary one values when provided by a manufacturer. In addition, performing an erase operation on the NAND flash storage cells sets the binary values in each storage cell to a binary one, such that programming of the storage cells comprises changing certain storage cells to a binary zero value.

Each of the storage elements 216, 218, 220, in one embodiment, store binary data in a plurality of storage cells that exhibit a bias. Each storage cell stores one or more binary bits, or values. Flash memory storage cells may be single-level cells ("SLC") that each store a single binary bit, or multi-level cells ("MLC") that each store two or more binary bits. Examples of storage cells include transistors, capacitors, magnetic elements, mechanical elements, optical elements, and the like. In flash memory, each storage cell is typically a floating-gate transistor. NRAM, MRAM, DRAM, PRAM, and other types of solid-state storage may have other types of storage cells, and may store either a single binary bit or two or more binary bits per storage cell.

In one embodiment, the storage cells in the storage elements 216, 218, 220 in an empty or erased state store initial binary values. The initial binary values represent a bias for the storage cells. For example, the storage cells may have a physical, electrical, mechanical, or other quality that causes them to store a certain value by default. In another embodiment, the bias may be intentionally selected based on design considerations of the solid-state storage 110, on security considerations, on compatibility issues, or the like, and may not be based on a default property of the storage cells.

For example, in one embodiment, the storage cells of the storage elements 216, 218, 220 may each store a binary value of one upon delivery from a manufacturer, and may each be erased to a value of one prior to being programmed, or written to, as is typical with flash memory. In another embodiment, the storage cells of the storage elements 216, 218, 220 may be biased toward binary zeroes, toward a balance or equal amount of binary ones and zeroes, toward a certain binary value for a plurality of bits, or the like. The process of erasing a logical erase block in a bank 214 of the solid-state storage 110 is described in greater detail below with regard to FIG. 4.

The bias module 318 biases a packet by changing a bias of the packet to more closely match a bias of the storage cells of the solid state storage 110. The bias module 318 biases the packets in a reversible manner, such that the inverse bias module 332 can convert the packets back to their original data values with their original biases. In one embodiment, the packets that the bias module 318 biases are sized for storage in a specific logical or physical storage region or division of the solid-state storage 110, such as an erase block, a virtual erase block, a page, a virtual page, an ECC chunk, a division within a page, or the like. In one embodiment, the bias module 318 selectively biases certain packets based on a bias of the packets, and may not bias other packets. The bias module 318 is described in greater detail below with regard to U.S. Patent Application Ser. No. 61/305496 filed 17 Feb. 2010, which is hereby incorporated by reference.

By biasing data packets toward the bias of the storage cells, the bias module 318 increases performance and endurance of the solid-state storage 110 and the solid-state storage device 102. For example, biasing packets to more closely match the bias of the storage cells decreases write times and erase times because fewer actual storage cells must be changed to execute the operation. It also increases the writable life of the storage cells because fewer operations that are executed on a storage cell mean that the storage cell will last longer before wear begins to affect the storage cell. In certain embodiments, biasing data packets may decrease power consumption or have other additional benefits. Because, in one embodiment, the storage cells store initial binary values that satisfy a bias just prior to being programmed or written to, the closer that the data packets match the bias of the storage cells, the fewer the number of storage cells that are changed to store the data packets, and the more storage cells that remain in a biased state.

As depicted, the bias module 318 biases the one or more packets prior to sending the packets to the ECC generator 304. Depending on the method that the bias module 318 uses to bias the packets, and on other design considerations, in a further embodiment, the bias module 318 may receive data subsequent to the ECC generator 304 in the write data pipeline 106, or be placed elsewhere in the write data pipeline 106. For example, in certain embodiments, it may be beneficial to keep ECC data separate from data that the bias module 318 biases, while in other embodiments it may be beneficial for the bias module 318 to bias data that includes ECC data from the ECC generator 304.

In another embodiment, the bias module 318 may be integrated with another element of the write data pipeline 106, such as the compression module 312, the encryption module 314, the ECC generator 304, or the like. The bias module 318 and corresponding inverse bias module 332 transparently increase the performance of the solid-state storage 110 as the bias module 318 biases data packets before they are written and the inverse bias module 332 converts the biased data packets back to their original state after they are read.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption keys used by the encryption module 314 to encrypt data may not be common to all data stored within the solid-state storage device 102 but may vary on an object basis and received in conjunction with receiving data segments as described below. For example, an encryption key for a data segment to be encrypted by the encryption module 314 may be received with the data segment or may be received as part of a command to write an object to which the data segment belongs. The solid-sate storage device 102 may use and store a non-secret cryptographic nonce in each object packet that is used in conjunction with the encryption key. A different nonce may be stored with every packet. Data segments may be split between multiple packets with unique nonces for the purpose of improving protection by the encryption algorithm.

The encryption key may be received from a client 114, a computer 112, key manager, or other device that holds the encryption key to be used to encrypt the data segment. In one embodiment, encryption keys are transferred to the solid-state storage controller 104 from one of a solid-state storage device 102, computer 112, client 114, or other external agent which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the solid-state storage device 102 allows object-by-object or segment-by-segment data encryption without a single file system or other external system to keep track of the different encryption keys used to store corresponding objects or data segments. Each requesting device 155 or related key manager independently manages encryption keys used to encrypt only the objects or data segments sent by the requesting device 155.

In one embodiment, the encryption module 314 may encrypt the one or more packets using an encryption key unique to the solid-state storage device 102. The encryption module 314 may perform this media encryption independently, or in addition to the encryption described above. Typically, the entire packet is encrypted, including the headers. In another embodiment, headers are not encrypted. The media encryption by the encryption module 314 provides a level of security for data stored in the solid-state storage 110. For example, where data is encrypted with media encryption unique to the specific solid-state storage device 102, if the solid-state storage 110 is connected to a different solid-state storage controller 104, solid-state storage device 102, or computer 112, the contents of the solid-state storage 110 typically could not be read without use of the same encryption key used during the write of the data to the solid-state storage 110 without significant effort.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the solid-state storage device 102 is beneficial so that clients 114 or other devices writing data to the solid-state storage device 102 may each specify a compression routine or so that one can specify a compression routine while another specifies no compression. Selection of compression routines may also be selected according to default settings on a per object type or object class basis. For example, a first object of a specific object may be able to override default compression routine settings and a second object of the same object class and object type may use the default compression routine and a third object of the same object class and object type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular section of storage may be recovered. This determination may be due to a lack of available storage capacity, the percentage of data marked as invalid reaching a threshold, a consolidation of valid data, an error detection rate for that section of storage reaching a threshold, or improving performance based on data distribution, etc. Numerous factors may be considered by a garbage collection algorithm to determine when a section of storage is to be recovered.

Once a section of storage has been marked for recovery, valid packets in the section typically must be relocated. The garbage collector bypass 316 allows packets to be read into the read data pipeline 108 and then transferred directly to the write data pipeline 106 without being routed out of the solid-state storage controller 104. In one embodiment, the garbage collector bypass 316 is part of an autonomous garbage collector system that operates within the solid-state storage device 102. This allows the solid-state storage device 102 to manage data so that data is systematically spread throughout the solid-state storage 110 to improve performance, data reliability and to avoid overuse and underuse of any one location or area of the solid-state storage 110 and to lengthen the useful life of the solid-state storage 110.

The garbage collector bypass 316 coordinates insertion of segments into the write data pipeline 106 with other segments being written by clients 114 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 108 to fill the remainder of the virtual page in order to improve the efficiency of storage within the Solid-State Storage 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the solid-state storage 110. This allows a write operation to send an entire page of data to the solid-state storage 110 without interruption. By sizing the write buffer 320 of the write data pipeline 106 and buffers within the read data pipeline 108 to be the same capacity or larger than a storage write buffer within the solid-state storage 110, writing and reading data is more efficient since a single write command may be crafted to send a full virtual page of data to the solid-state storage 110 instead of multiple commands.

While the write buffer 320 is being filled, the solid-state storage 110 may be used for other read operations. This is advantageous because other solid-state devices with a smaller write buffer or no write buffer may tie up the solid-state storage when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each solid-state storage element 216, 218, 220 to the designated page within each solid-state storage element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the solid-state storage 110.

In another embodiment, the write buffer 320 is sized smaller than a virtual page so that less than a page of information could be written to a storage write buffer in the solid-state storage 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the solid-state storage 110 to fill the pages of a virtual page prior to programming the data. In this way a data stall in the write data pipeline 106 would not stall reading from the solid-state storage device 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the solid-state storage controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the solid-state storage 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the solid-state storage 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In one embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device 155 may correct the ECC block or replace the data using another copy, such as a backup or minor copy, and then may use the replacement data of the requested data packet or return it to the read data pipeline 108. The requesting device 155 may use header information in the requested packet in error to identify data required to replace the corrupted requested packet or to replace the object to which the packet belongs. In another embodiment, the solid-state storage controller 104 stores data using some type of RAID and is able to recover the corrupted data. In another embodiment, the ECC correction module 322 sends an interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required by the object index reconstruction module 272. Further examples include the transfer of packets of various types destined for use within the solid-state storage device 102. In another embodiment, the depacketizer 324 operation may be packet type dependent.

The read data pipeline 108 includes an alignment module 326 that receives data from the depacketizer 324 and removes unwanted data. In one embodiment, a read command sent to the solid-state storage 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of an object in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device 155 and joined to form a response. For example, data from a portion of a first data packet may be combined with data from a portion of a second data packet. If a data segment is larger than a data requested by the requesting device 155, the alignment module 326 may discard the unwanted data.

In one embodiment, the read data pipeline 108 includes a read synchronization buffer 328 that buffers one or more requested packets read from the solid-state storage 110 prior to processing by the read data pipeline 108. The read synchronization buffer 328 is at the boundary between the solid-state storage clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device 155. The output buffer 330 accounts for differences between when data segments are received from stages of the read data pipeline 108 and when the data segments are transmitted to other parts of the solid-state storage controller 104 or to the requesting device 155. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes an inverse bias module 332 that receives one or more requested biased packets from the ECC correction module 322 and converts the one or more requested packets back to their original form by reversing the biasing process of the bias module 318 prior to sending the one or more requested packets to the depacketizer 324. In one embodiment, the inverse bias module 332 may use one or more indicators stored by the bias module 318 to convert the biased packets back to their original data.

In a further embodiment, the inverse bias module 332 converts the biased packets back to their original data without using an indicator. Instead of using an indicator, the inverse bias module 332 may implement an algorithm that is the inverse operation of the bias module 318. This algorithm may inverse the bias for each data packet received and/or a select number of data packets received. In the depicted embodiment, the inverse bias module 332 is located between the ECC correction module 322 and the depacketizer 324. In a further embodiment, the inverse bias module 332 may be located elsewhere in the read data pipeline 108, based on the location of the bias module 318 in the write data pipeline 106. The inverse bias module 332 is described in greater detail with regard to U.S. Patent Application Ser. No. 61/305496 filed 17 Feb. 2010, which is hereby incorporated by reference.

In another embodiment, the read data pipeline 108 includes a decryption module 334 that decrypts a data segment formatted by the depacketizer 324 prior to sending the data segment to the output buffer 330. The data segment may be decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. When the packet was stored with a non-secret cryptographic nonce, the nonce is used in conjunction with an encryption key to decrypt the data packet. The encryption key may be received from a client 114, a computer 112, key manager, or other device that manages the encryption key to be used by the solid-state storage controller 104.

In another embodiment, the read data pipeline 108 includes a decompression module 336 that decompresses a data segment formatted by the depacketizer 324. In one embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per object type or object class basis. A first packet of a first object may be able to override a default decompression routine and a second packet of a second object of the same object class and object type may use the default decompression routine and a third packet of a third object of the same object class and object type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The solid-state storage controller 104 includes control and status registers 340 and corresponding control queues 342. The control and status registers 340 and control queues 342 facilitate control and sequencing commands and subcommands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

Figure 4:
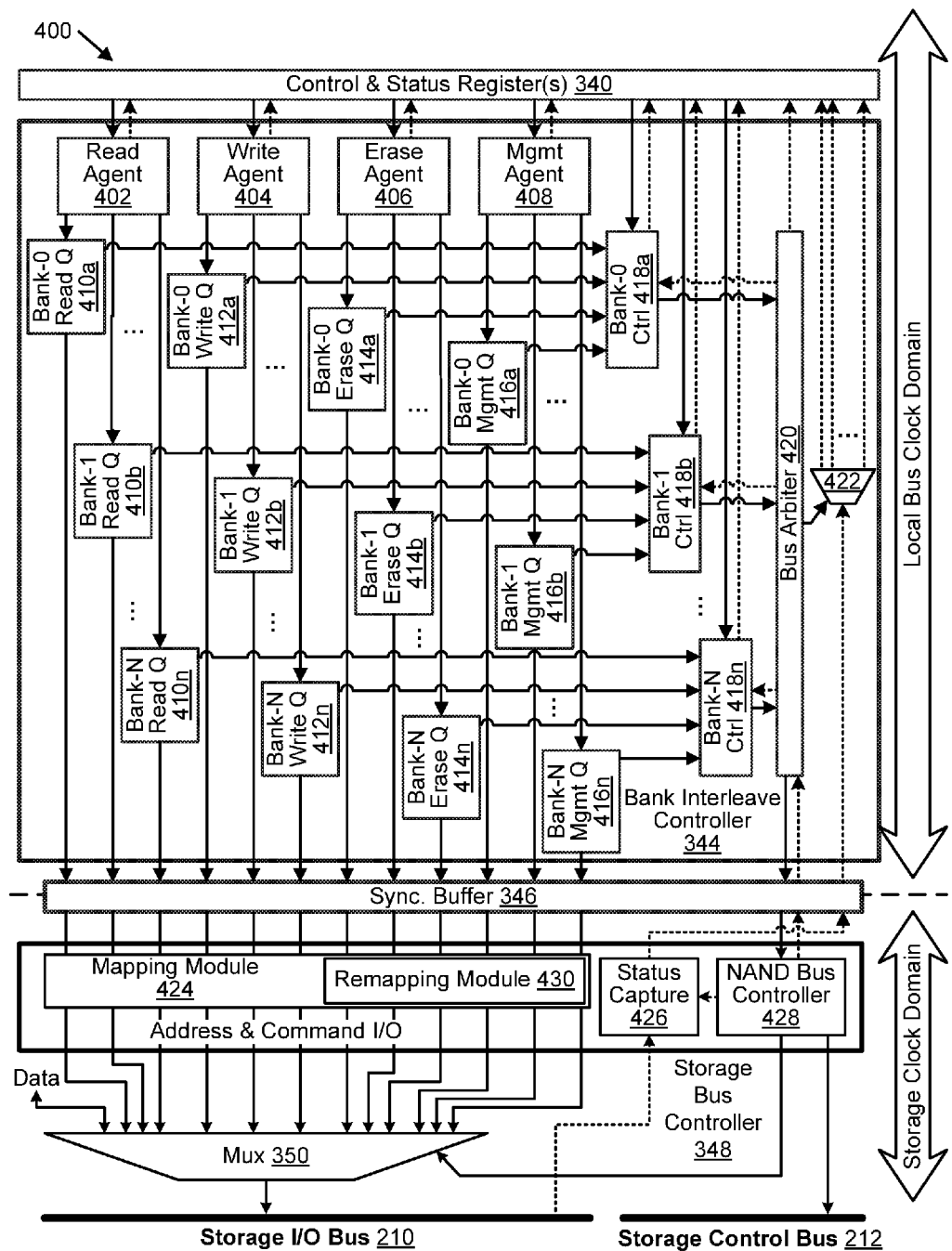
FIG. 4 is a schematic block diagram illustrating one embodiment of a bank interleave controller in the solid-state storage controller in accordance with the present invention.

The solid-state storage controller 104 and or solid-state storage device 102 may also include a bank interleave controller 344, a synchronization buffer 346, a storage bus controller 348, and a multiplexer ("MUX") 350, which are described in relation to FIG. 4.

Bank Interleave

FIG. 4 is a schematic block diagram illustrating one embodiment 400 of a bank interleave controller 344 in the solid-state storage controller 104 in accordance with the present invention. The bank interleave controller 344 is connected to the control and status registers 340 and to the storage I/O bus 210 and storage control bus 212 through the MUX 350, storage bus controller 348, and synchronization buffer 346, which are described below. The bank interleave controller 344 includes a read agent 402, a write agent 404, an erase agent 406, a management agent 408, read queues 410a-n, write queues 412a-n, erase queues 414a-n, and management queues 416a-n for the banks 214 in the solid-state storage 110, bank controllers 418a-n, a bus arbiter 420, and a status MUX 422, which are described below. The storage bus controller 348 includes a mapping module 424 with a remapping module 430, a status capture module 426, and a NAND bus controller 428, which are described below.

The bank interleave controller 344 directs one or more commands to two or more queues in the bank interleave controller 104 and coordinates among the banks 214 of the solid-state storage 110 execution of the commands stored in the queues, such that a command of a first type executes on one bank 214a while a command of a second type executes on a second bank 214b. The one or more commands are separated by command type into the queues. Each bank 214 of the solid-state storage 110 has a corresponding set of queues within the bank interleave controller 344 and each set of queues includes a queue for each command type.

The bank interleave controller 344 coordinates among the banks 214 of the solid-state storage 110 execution of the commands stored in the queues. For example, a command of a first type executes on one bank 214a while a command of a second type executes on a second bank 214b. Typically the command types and queue types include read and write commands and queues 410, 412, but may also include other commands and queues that are storage media specific. For example, in the embodiment depicted in FIG. 4, erase and management queues 414, 416 are included and would be appropriate for flash memory, NRAM, MRAM, DRAM, PRAM, etc.

For other types of solid-state storage 110, other types of commands and corresponding queues may be included without straying from the scope of the invention. The flexible nature of an FPGA solid-state storage controller 104 allows flexibility in storage media. If flash memory were changed to another solid-state storage type, the bank interleave controller 344, storage bus controller 348, and MUX 350 could be altered to accommodate the media type without significantly affecting the data pipelines 106, 108 and other solid-state storage controller 104 functions.

In the embodiment depicted in FIG. 4, the bank interleave controller 344 includes, for each bank 214, a read queue 410 for reading data from the solid-state storage 110, a write queue 412 for write commands to the solid-state storage 110, an erase queue 414 for erasing an erase block in the solid-state storage, an a management queue 416 for management commands. The bank interleave controller 344 also includes corresponding read, write, erase, and management agents 402, 404, 406, 408. In another embodiment, the control and status registers 340 and control queues 342 or similar components queue commands for data sent to the banks 214 of the solid-state storage 110 without a bank interleave controller 344.

The agents 402, 404, 406, 408, in one embodiment, direct commands of the appropriate type destined for a particular bank 214*a* to the correct queue for the bank 214*a*. For example, the read agent 402 may receive a read command for bank-1 214*b* and directs the read command to the bank-1 read queue 410*b*. The write agent 404 may receive a write command to write data to a location in bank-0 214*a* of the solid-state storage 110 and will then send the write command to the bank-0 write queue 412*a*. Similarly, the erase agent 406 may receive an erase command to erase an erase block in bank-1 214*b* and will then pass the erase command to the bank-1 erase queue 414*b*. The management agent 408 typically receives management commands, status requests, and the like, such as a reset command or a request to read a configuration register of a bank 214, such as bank-0 214*a*. The management agent 408 sends the management command to the bank-0 management queue 416*a*.

The agents 402, 404, 406, 408 typically also monitor status of the queues 410, 412, 414, 416 and send status, interrupt, or other messages when the queues 410, 412, 414, 416 are full, nearly full, non-functional, etc. In one embodiment, the agents 402, 404, 406, 408 receive commands and generate corresponding sub-commands. In one embodiment, the agents 402, 404, 406, 408 receive commands through the control & status registers 340 and generate corresponding sub-commands which are forwarded to the queues 410, 412, 414, 416. One of skill in the art will recognize other functions of the agents 402, 404, 406, 408.

The queues 410, 412, 414, 416 typically receive commands and store the commands until required to be sent to the solid-state storage banks 214. In a typical embodiment, the queues 410, 412, 414, 416 are first-in, first-out ("FIFO") registers or a similar component that operates as a FIFO. In another embodiment, the queues 410, 412, 414, 416 store commands in an order that matches data, order of importance, or other criteria.

The bank controllers 418 typically receive commands from the queues 410, 412, 414, 416 and generate appropriate sub-commands. For example, the bank-0 write queue 412*a* may receive a command to write a page of data packets to bank-0 214*a*. The bank-0 controller 418*a* may receive the write command at an appropriate time and may generate one or more write subcommands for each data packet stored in the write buffer 320 to be written to the page in bank-0 214*a*. For example, bank-0 controller 418*a* may generate commands to validate the status of bank 0 214*a* and the solid-state storage array 216, select the appropriate location for writing one or more data packets, clear the input buffers within the solid-state storage memory array 216, transfer the one or more data packets to the input buffers, program the input buffers into the selected location, verify that the data was correctly programmed, and if program failures occur do one or more of interrupting the master controller 224, retrying the write to the same physical location, and retrying the write to a different physical location. Additionally, in conjunction with example write command, the storage bus controller 348 will cause the one or more commands to multiplied to each of the each of the storage I/O buses 210*a-n* with the logical address of the command mapped to a first physical addresses for storage I/O bus 210*a*, and mapped to a second physical address for storage I/O bus 210*b*, and so forth as further described below.

Typically, bus arbiter 420 selects from among the bank controllers 418 and pulls subcommands from output queues within the bank controllers 418 and forwards these to the Storage Bus Controller 348 in a sequence that optimizes the performance of the banks 214. In another embodiment, the bus arbiter 420 may respond to a high level interrupt and modify the normal selection criteria. In another embodiment, the master controller 224 can control the bus arbiter 420 through the control and status registers 340. One of skill in the art will recognize other means by which the bus arbiter 420 may control and interleave the sequence of commands from the bank controllers 418 to the solid-state storage 110.

The bus arbiter 420 typically coordinates selection of appropriate commands, and corresponding data when required for the command type, from the bank controllers 418 and sends the commands and data to the storage bus controller 348. The bus arbiter 420 typically also sends commands to the storage control bus 212 to select the appropriate bank 214. For the case of flash memory or other solid-state storage 110 with an asynchronous, bi-directional serial storage I/O bus 210, only one command (control information) or set of data can be transmitted at a time. For example, when write commands or data are being transmitted to the solid-state storage 110 on the storage I/O bus 210, read commands, data being read, erase commands, management commands, or other status commands cannot be transmitted on the storage I/O bus 210. For example, when data is being read from the storage I/O bus 210, data cannot be written to the solid-state storage 110.

For example, during a write operation on bank-0 the bus arbiter 420 selects the bank-0 controller 418*a* which may have a write command or a series of write sub-commands on the top of its queue which cause the storage bus controller 348 to execute the following sequence. The bus arbiter 420 forwards the write command to the storage bus controller 348, which sets up a write command by selecting bank-0 214*a* through the storage control bus 212, sending a command to clear the input buffers of the solid-state storage elements 110 associated with the bank-0 214*a*, and sending a command to validate the status of the solid-state storage elements 216, 218, 220 associated with the bank-0 214*a*. The storage bus controller 348 then transmits a write subcommand on the storage I/O bus 210, which contains the physical addresses including the address of the logical erase block for each individual physical erase solid-stage storage element 216*a-m* as mapped from the logical erase block address. The storage bus controller 348 then muxes the write buffer 320 through the write sync buffer 308 to the storage I/O bus 210 through the MUX 350 and streams write data to the appropriate page. When the page is full, then storage bus controller 348 causes the solid-state storage elements 216*a-m* associated with the bank-0 214*a* to program the input buffer to the memory cells within the solid-state storage elements 216*a-m*. Finally, the storage bus controller 348 validates the status to ensure that page was correctly programmed.

A read operation is similar to the write example above. During a read operation, typically the bus arbiter 420, or other component of the bank interleave controller 344, receives data and corresponding status information and sends the data to the read data pipeline 108 while sending the status information on to the control and status registers 340. Typically, a read data command forwarded from bus arbiter 420 to the storage bus controller 348 will cause the MUX 350 to gate the read data on storage I/O bus 210 to the read data pipeline 108 and send status information to the appropriate control and status registers 340 through the status MUX 422.

The bus arbiter 420 coordinates the various command types and data access modes so that only an appropriate command type or corresponding data is on the bus at any given time. If the bus arbiter 420 has selected a write command, and write subcommands and corresponding data are being written to the solid-state storage 110, the bus arbiter 420 will not allow other command types on the storage I/O bus 210. Beneficially, the bus arbiter 420 uses timing information, such as predicted command execution times, along with status information received concerning bank 214 status to coordinate execution of the various commands on the bus with the goal of minimizing or eliminating idle time of the busses.

The master controller 224 through the bus arbiter 420 typically uses expected completion times of the commands stored in the queues 410, 412, 414, 416, along with status information, so that when the subcommands associated with a command are executing on one bank 214a, other subcommands of other commands are executing on other banks 214b-n. When one command is fully executed on a bank 214a, the bus arbiter 420 directs another command to the bank 214a. The bus arbiter 420 may also coordinate commands stored in the queues 410, 412, 414, 416 with other commands that are not stored in the queues 410, 412, 414, 416.

For example, an erase command may be sent out to erase a group of erase blocks within the solid-state storage 110. An erase command may take 10 to 1000 times more time to execute than a write or a read command or 10 to 100 times more time to execute than a program command. For N banks 214, the bank interleave controller 344 may split the erase command into N commands, each to erase a virtual erase block of a bank 214a. While Bank 0 214a is executing an erase command, the bus arbiter 420 may select other commands for execution on the other banks 214b-n. The bus arbiter 420 may also work with other components, such as the storage bus controller 348, the master controller 224, etc., to coordinate command execution among the buses. Coordinating execution of commands using the bus arbiter 420, bank controllers 418, queues 410, 412, 414, 416, and agents 402, 404, 406, 408 of the bank interleave controller 344 can dramatically increase performance over other solid-state storage systems without a bank interleave function.

In one embodiment, the solid-state controller 104 includes one bank interleave controller 344 that serves all of the storage elements 216, 218, 220 of the solid-state storage 110. In another embodiment, the solid-state controller 104 includes a bank interleave controller 344 for each set of storage elements 216a-m, 218a-m, 220a-m. For example, one bank interleave controller 344 serves one set of storage elements SSS 0.0-SSS N.0 216a, 218a, ... 220a, a second bank interleave controller 344 serves a second set of storage elements SSS 1.0-SSS N.1 216b, 218b, ... 220b, etc.

Storage-Specific Components

The solid-state storage controller 104 includes a synchronization buffer 346 that buffers commands and status messages sent and received from the solid-state storage 110. The synchronization buffer 346 is located at the boundary between the solid-state storage clock domain and the local bus clock domain and provides buffering to account for the clock domain differences. The synchronization buffer 346, write synchronization buffer 308, and read synchronization buffer 328 may be independent or may act together to buffer data, commands, status messages, etc. In one embodiment, the synchronization buffer 346 is located where there are the fewest number of signals crossing the clock domains. One skilled in the art will recognize that synchronization between clock domains may be arbitrarily moved to other locations within the solid-state storage device 102 in order to optimize some aspect of design implementation.

The solid-state storage controller 104 includes a storage bus controller 348 that interprets and translates commands for data sent to and read from the solid-state storage 110 and status messages received from the solid-state storage 110 based on the type of solid-state storage 110. For example, the storage bus controller 348 may have different timing requirements for different types of storage, storage with different performance characteristics, storage from different manufacturers, etc. The storage bus controller 348 also sends control commands to the storage control bus 212.

In one embodiment, the solid-state storage controller 104 includes a MUX 350 that comprises an array of multiplexers 350a-n where each multiplexer is dedicated to a set of solid-state storage elements either a row or a column in the solid-state storage array 110. For example, multiplexer 350a is associated with solid-state storage elements 216a, 218a, 220a. MUX 350 routes the data from the write data pipeline 106 and commands from the storage bus controller 348 to the solid-state storage 110 via the storage I/O bus 210 and routes data and status messages from the solid-state storage 110 via the storage I/O bus 210 to the read data pipeline 108 and to the control and status registers 340 through the storage bus controller 348, synchronization buffer 346, and bank interleave controller 344.

In one embodiment, the solid-state storage controller 104 includes a MUX 350 for each column of solid-state storage elements (e.g. SSS 0.0 216a, SSS 1.0 218a, SSS N.0 220a). A MUX 350 combines data from the write data pipeline 106 and commands sent to the solid-state storage 110 via the storage I/O bus 210 and separates data to be processed by the read data pipeline 108 from commands. Packets stored in the write buffer 320 are directed on busses out of the write buffer 320 through a write synchronization buffer 308 for each column of solid-state storage elements (SSS 0.x to SSS N.x 216, 218, 220) to the MUX 350 for each column of solid-state storage elements (SSS 0.x to SSS N.x 216, 218, 220). The commands and read data are received by the MUXes 350 from the storage I/O bus 210. The MUXes 350 also direct status messages to the storage bus controller 348.

The storage bus controller 348 includes a mapping module 424. The mapping module 424 maps a logical address of an erase block to one or more physical addresses of an erase block. For example, a solid-state storage 110 with an array of twenty storage elements (e.g. SSS 0.0 to SSS 0.M 216) per bank 214a may have a logical address for a particular erase block mapped to twenty physical addresses of the erase block, one physical address per storage element. Because the storage elements are accessed in parallel, erase blocks at the same position in each storage element in a column of storage elements 216a, 218a, 220a will share a physical address. To select one erase block (e.g. in storage element SSS 0.0 216a) instead of all erase blocks in the column (e.g. in storage elements SSS 0.0, 1.0, ... N.0 216a, 218a, 220a), one bank (in this case Bank 0 214a) is selected.

This logical-to-physical mapping for erase blocks is beneficial because if one erase block becomes damaged or inaccessible, the mapping can be changed to map to another erase block. This mitigates the loss of losing an entire virtual erase block when one element's erase block is faulty. The remapping module 430 changes a mapping of a logical address of an erase block to one or more physical addresses of a virtual erase block (spread over the array of storage elements). For example, virtual erase block 1 may be mapped to erase block 1 of storage element SSS 0.0 216a, to erase block 1 of storage element SSS 0.1 216*b*, ..., and to storage element 0.M 216*m*, virtual erase block 2 may be mapped to erase block 2 of storage element SSS 1.0 218*a*, to erase block 2 of storage element SSS 1.1 218*b*, ..., and to storage element 1.M 218*m*, etc. Alternatively, virtual erase block 1 may be mapped to one erase block from each storage element in an array such that virtual erase block 1 includes erase block 1 of storage element SSS 0.0 216*a* to erase block 1 of storage element SSS 0.1 216*b* to storage element 0.M 216*m*, and erase block 1 of storage element SSS 1.0 218*a* to erase block 1 of storage element SSS 1.1 218*b*, ..., and to storage element 1.M 218*m*, for each storage element in the array up to erase block 1 of storage element N.M 220*m*.

If erase block 1 of a storage element SSS0.0 216*a* is damaged, experiencing errors due to wear, etc., or cannot be used for some reason, the remapping module 430 could change the logical-to-physical mapping for the logical address that pointed to erase block 1 of virtual erase block 1. If a spare erase block (call it erase block 221) of storage element SSS 0.0 216*a* is available and currently not mapped, the remapping module 430 could change the mapping of virtual erase block 1 to point to erase block 221 of storage element SSS 0.0 216*a*, while continuing to point to erase block 1 of storage element SSS 0.1 216*b*, erase block 1 of storage element SSS 0.2 (not shown) ..., and to storage element 0.M 216*m*. The mapping module 424 or remapping module 430 could map erase blocks in a prescribed order (virtual erase block 1 to erase block 1 of the storage elements, virtual erase block 2 to erase block 2 of the storage elements, etc.) or may map erase blocks of the storage elements 216, 218, 220 in another order based on some other criteria.

In one embodiment, the erase blocks could be grouped by access time. Grouping by access time, meaning time to execute a command, such as programming (writing) data into pages of specific erase blocks, can level command completion so that a command executed across the erase blocks of a virtual erase block is not limited by the slowest erase block. In other embodiments, the erase blocks may be grouped by wear level, health, etc. One of skill in the art will recognize other factors to consider when mapping or remapping erase blocks.

In one embodiment, the storage bus controller 348 includes a status capture module 426 that receives status messages from the solid-state storage 110 and sends the status messages to the status MUX 422. In another embodiment, when the solid-state storage 110 is flash memory, the storage bus controller 348 includes a NAND bus controller 428. The NAND bus controller 428 directs commands from the read and write data pipelines 106, 108 to the correct location in the solid-state storage 110, coordinates timing of command execution based on characteristics of the flash memory, etc. If the solid-state storage 110 is another solid-state storage type, the NAND bus controller 428 would be replaced by a bus controller specific to the storage type. One of skill in the art will recognize other functions of a NAND bus controller 428.

Logical-to-Physical Translation and Deallocation

Figure 5:
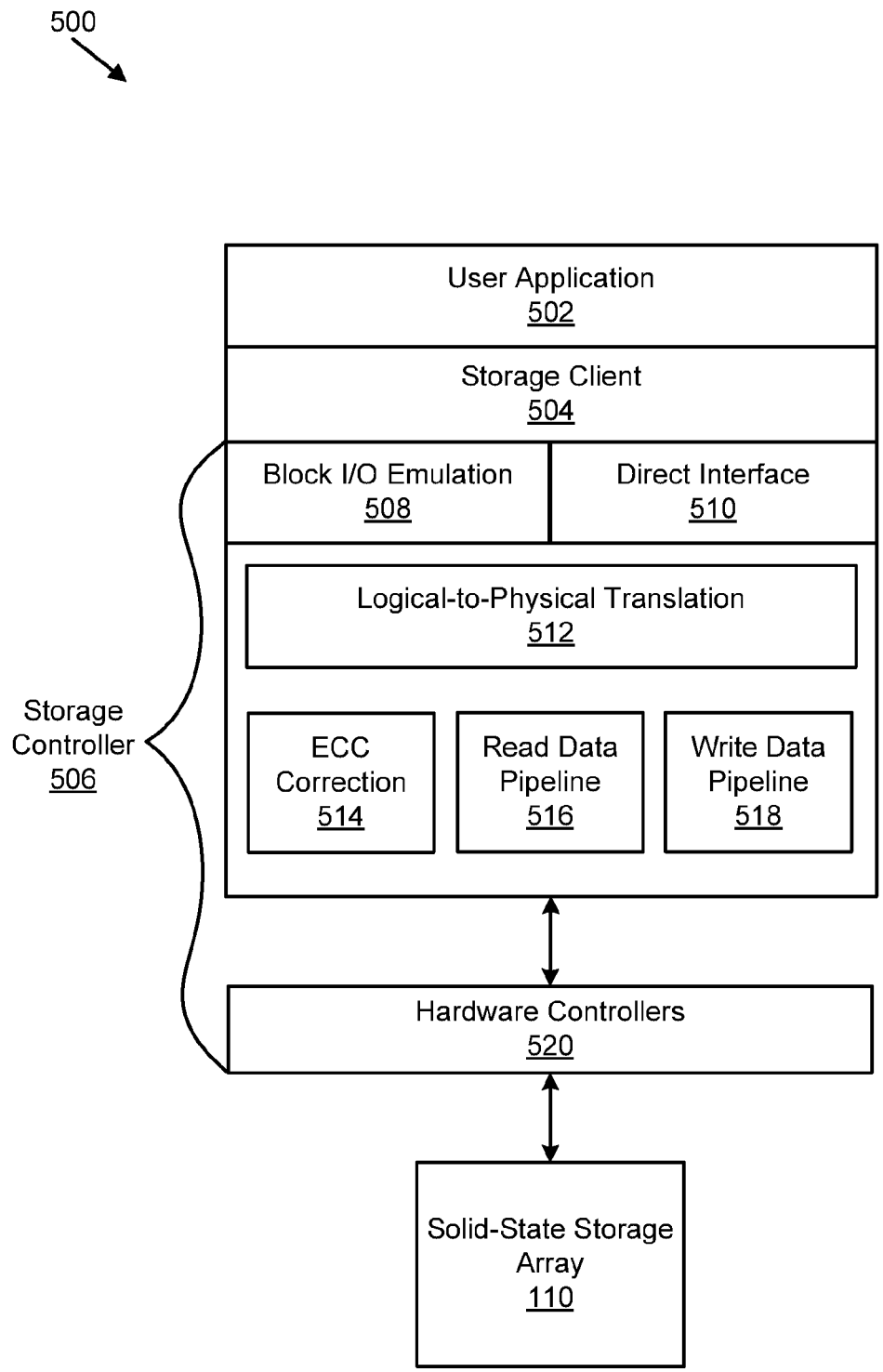
FIG. 5 is a schematic block diagram illustrating one embodiment of a logical representation of a solid-state storage controller with a logical-to-physical translation layer in accordance with the present invention.

FIG. 5 is a schematic block diagram illustrating a logical representation 500 of a solid-state storage controller 506 with a logical-to-physical translation layer 512 in accordance with the present invention. The storage controller 506 may be similar, in certain embodiments, to the solid-state storage controller 104 depicted in FIG. 1 and FIG. 2 and may include one or more solid-state storage controllers 104. The depicted embodiment shows a user application 502 in communication with a storage client 504. The storage client 504 is in communication with a storage controller 506 that includes the logical-to-physical translation layer 512, an ECC correction module 514, a read data pipeline 516, and a write data pipeline 518.

The storage controller 506 manages a solid-state storage array 522. The storage controller 506 may include various hardware and software controllers, drivers, and software, such as the depicted hardware controllers 520.

In one embodiment, the depicted hardware controllers 520 may be substantially similar to and include similar functionality as the solid-state controllers 104 and accompanying controllers and modules depicted in FIG. 2 and/or the bank interleave controller 344 and storage bus controller 348 depicted in FIG. 3. Furthermore, the ECC correction module 514 may be substantially similar and include similar functionality to the ECC correction module 322 and/or the ECC generator 304 depicted in FIG. 3. In addition, the read data pipeline 516 and the write data pipeline 518 may be substantially similar to the read data pipeline 108 and the write data pipeline 106 depicted in FIG. 1 and FIG. 3. The solid-state storage array 522 may include an array of solid-state storage banks similar to the solid-state storage media 110 and corresponding solid-state storage banks 214 depicted in FIG. 2.

In one embodiment, the user application 502 is a software application operating on or in conjunction with the storage client 504. The storage client 504 manages files and data and utilizes the functions and features of the storage controller 506 and associated solid-state storage array 522. Representative examples of storage clients include, but are not limited to, a server, a file system, an operating system, a database management system ("DBMS"), a volume manager, and the like. The storage client 504 is in communication with the storage controller 506. In one embodiment, the storage client 504 communicates through an Input/Output (I/O) interface represented by a block I/O emulation layer 508.

Certain conventional block storage devices divide the storage media into volumes or partitions. Each volume or partition may include a plurality of sectors. One or more sectors are organized into a logical block. In certain storage systems, such as those interfacing with the Windows® operating systems, the logical blocks are referred to as clusters. In other storage systems, such as those interfacing with UNIX, Linux, or similar operating systems, the logical blocks are referred to simply as blocks. A logical block or cluster represents a smallest physical amount of storage space on the storage media that is managed by the storage manager. A block storage device may associate n logical blocks available for user data storage across the storage media with a logical block address, numbered from 0 to n. In certain block storage devices, the logical block addresses may range from 0 to n per volume or partition. In conventional block storage devices, a logical block address maps directly to a particular logical block. In conventional block storage devices, each logical block maps to a particular set of physical sectors on the storage media.

However, certain storage devices 102 do not directly or necessarily associate logical block addresses with particular physical blocks. These storage devices 102 may emulate a conventional block storage interface to maintain compatibility with block storage clients 504.

When the storage client 504 communicates through the block I/O emulation layer 508, the storage device 102 appears to the storage client 504 as a conventional block storage device. In one embodiment, the storage controller 506 provides a block I/O emulation layer 508 which serves as a block device interface, or API. In this embodiment, the storage client 504 communicates with the storage device 102 through this block device interface. In one embodiment, the block I/O emulation layer 508 receives commands and logical block addresses from the storage client 504 in accordance with this block device interface. As a result, the block I/O emulation layer 508 provides the storage device 102 compatibility with block storage clients 504.

In one embodiment, a storage client 504 communicates with the storage controller 506 through a direct interface layer 510. In this embodiment, the storage device 102 directly exchanges information specific to non-volatile storage devices. A storage device 102 using direct interface 510 may store data on the solid-state storage media 110 as blocks, sectors, pages, logical blocks, logical pages, erase blocks, logical erase blocks, ECC chunks, logical ECC chunks, or in any other format or structure advantageous to the technical characteristics of the solid-state storage media 110. The storage controller 506 receives a logical address and a command from the storage client 504 and performs the corresponding operation in relation to the non-volatile solid-state storage media 110. The storage controller 506 may support a block I/O emulation layer 508, a direct interface 510, or both a block I/O emulation layer 508 and a direct interface 510.

As described above, certain storage devices, while appearing to a storage client 504 to be a block storage device, do not directly associate particular logical block addresses with particular physical blocks, also referred to in the art as sectors. Such storage devices may use a logical-to-physical translation layer 512. The logical-to-physical translation layer 512 provides a level of abstraction between the logical block addresses used by the storage client 504, and the physical block addresses at which the storage controller 506 stores the data. The logical-to-physical translation layer 512 maps logical block addresses to physical block addresses of data stored on solid-state storage media 110. This mapping allows data to be referenced in a logical address space using logical identifiers, such as a logical block address. A logical identifier does not indicate the physical location of data on the solid-state storage media 110, but is an abstract reference to the data.

The storage controller 506 manages the physical block addresses in the physical address space. In one example, contiguous logical block addresses may in fact be stored in non-contiguous physical block addresses as the logical-to-physical translation layer 512 determines the location on the solid-state storage media 110 to perform data operations.

Furthermore, in one embodiment, the logical address space is substantially larger than the physical address space. This "thinly provisioned" or "sparse address space" embodiment, allows the number of logical identifiers for data references to greatly exceed the number of possible physical addresses.

In one embodiment, the logical-to-physical translation layer 512 includes a map or index that maps logical block addresses to physical block addresses. The map may be in the form of a B-tree, a content addressable memory ("CAM"), a binary tree, and/or a hash table, and the like. In certain embodiments, the logical-to-physical translation layer 512 is a tree with nodes that represent logical block addresses and comprise corresponding physical block addresses.

As stated above, in conventional block storage devices, a logical block address maps directly to a particular physical block. When a storage client 504 communicating with the conventional block storage device deletes data for a particular logical block address, the storage client 504 may note that the particular logical block address is deleted and can re-use the physical block associated with that deleted logical block address without the need to perform any other action.

Conversely, when a storage client 504, communicating with a storage controller 104 with a logical-to-physical translation layer 512 (a storage controller 104 that does not map a logical block address directly to a particular physical block), deletes a logical block address, the corresponding physical block address remains allocated because the storage client 504 does not communicate the change in used blocks to the storage controller 506. The storage client 504 may not be configured to communicate changes in used blocks (also referred to herein as "data block usage information"). Because the storage client 504 uses the block I/O emulation 508 layer, the storage client 504 may erroneously believe that the storage controller 506 is a conventional storage controller that would not utilize the data block usage information. Or, in certain embodiments, other software layers between the storage client 504 and the storage controller 506 may fail to pass on data block usage information.

Consequently, the storage controller 104 preserves the relationship between the logical block address and a physical address and the data on the storage device 102 corresponding to the physical block. As the number of allocated blocks increases, the performance of the storage controller 104 may suffer depending on the configuration of the storage controller 104.

Specifically, in certain embodiments, the storage controller 506 is configured to store data sequentially, using an append-only writing process, and use a storage space recovery process that re-uses non-volatile storage media storing deallocated/unused logical blocks. Specifically, as described above, the storage controller 506 may sequentially write data on the solid-state storage media 110 in a log structured format and within one or more physical structures of the storage elements, the data is sequentially stored on the solid-state storage media 110.

As a result of storing data sequentially and using an append-only writing process, the storage controller 506 achieves a high write throughput and a high number of I/O operations per second ("IOPS"). The storage controller 506 includes a storage space recovery, or garbage collection process that re-uses data storage cells to provide sufficient storage capacity. The storage space recovery process reuses storage cells for logical blocks marked as deallocated, invalid, unused, or otherwise designated as available for storage space recovery in the logical-physical translation layer 512.

As described above, the storage space recovery process determines that a particular section of storage may be recovered. Once a section of storage has been marked for recovery, the storage controller 506 may relocate valid blocks in the section. The storage space recovery process, when relocating valid blocks, copies the packets and writes them to another location so that the particular section of storage may be reused as available storage space, typically after an erase operation on the particular section. The storage controller 506 may then use the available storage space to continue sequentially writing data in an append-only fashion. Consequently, the storage controller 104 expends resources and overhead in preserving data in valid blocks. Therefore, physical blocks corresponding to deleted logical blocks may be unnecessarily preserved by the storage controller 104, which expends unnecessary resources in relocating the physical blocks during storage space recovery.

Some storage devices 102 are configured to receive messages or commands notifying the storage device 102 of these unused logical blocks so that the storage device 102 may deallocate the corresponding physical blocks. As used herein, to deallocate a physical block includes marking the physical block as invalid, unused, or otherwise designating the physical block as available for storage space recovery, its contents on storage media no longer needing to be preserved by the storage controller 506. Data block usage information, in reference to the storage controller 506, may also refer to information maintained by the storage controller 506 regarding which physical blocks are allocated and/or deallocated/unallocated and changes in the allocation of physical blocks and/or logical-to-physical block mapping information. Data block usage information, in reference to the storage controller 506, may also refer to information maintained by the storage controller 506 regarding which blocks are in use and which blocks are not in use by a storage client. Use of a block may include storing of data in the block on behalf of the client, reserving the block for use by a client, and the like.

While physical blocks may be deallocated, in certain embodiments, the storage controller 506 may not immediately erase the data on the storage media. An erase operation may be performed later in time. In certain embodiments, the data in a deallocated physical block may be marked as unavailable by the storage controller 506 such that subsequent requests for data in the physical block return a null result or an empty set of data.

One example of a command or message for such deallocation is the "Trim" function of the "Data Set Management" command under the T13 technical committee command set specification maintained by INCITS. A storage device, upon receiving a Trim command, may deallocate physical blocks for logical blocks whose data is no longer needed by the storage client 504. A storage controller 506 that deallocates physical blocks may achieve better performance and increased storage space, especially storage controllers 506 that write data using certain processes and/or use a similar data storage recovery process as that described above.

Consequently, the performance of the storage controller 506 is enhanced as physical blocks are deallocated when they are no longer needed such as through the Trim command or other similar deallocation commands issued to the storage controller 506.

Direct Interface Between a Memory Controller and Non-Volatile Memory

Figure 6:
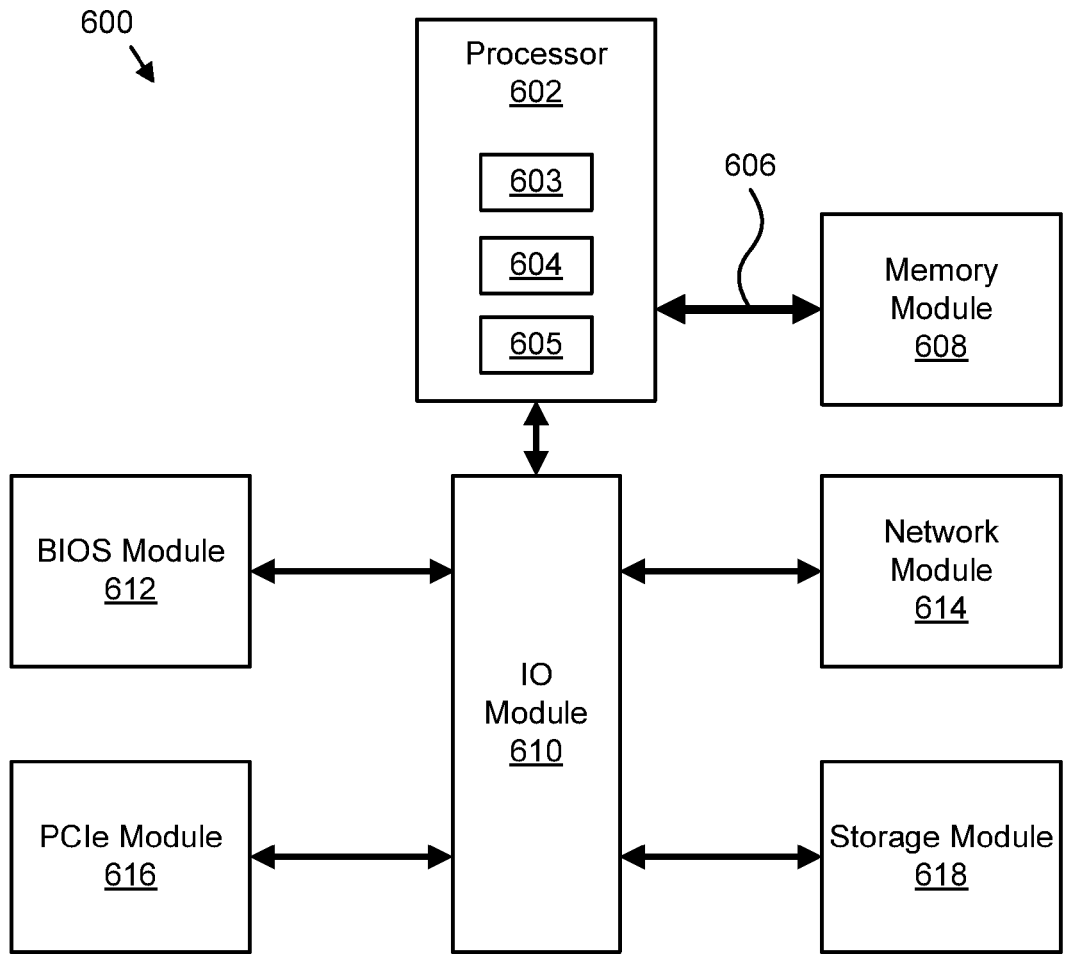
FIG. 6 is a schematic block diagram illustrating one embodiment of a computing device in accordance with the present invention.

FIG. 6 illustrates one embodiment of a computing device 600 in accordance with the present invention. The computing device 600 may be one embodiment of the computer 112 depicted in FIG. 1. The computing device 600 includes a processor 602, a memory module 608, an IO module 610, a basic input/output system ("BIOS") module 612, a network module 614, a peripheral component interconnect express ("PCIe") module 616, and a storage module 618. One of skill in the art will recognize that other configurations of a computing device 600 may be employed with the embodiments described herein.

The processor 602 executes computer readable programs stored on the memory module 604 as is well known to those skilled in the art. The processor 602 may include a cache 603 to reduce the average time to access the memory module 608. In one embodiment, the processor 602 comprises a multiprocessor having one or more cores (independent processing units). The cache 603 may store copies of instructions and data from frequently used locations in the memory module 608. The processor 602 may include a memory management unit ("MMU") 604 that translates logical memory addresses from a client (such as an operating system) to physical memory addresses that, in conventional computing devices, may correspond to physical locations on the storage media of the memory module 608. For example, in conventional computing devices, an operating system may send a data read request to the processor 602 along with logical addresses for a page stored in the memory module 608. The MMU 604 may translate the logical addresses to physical media addresses corresponding to locations of page data on the memory module 608.

In addition, the processor 602 includes a memory controller 605 that manages data communication between the processor 602 and the memory module 608. In conventional computing devices, the memory controller 605, when reading or writing data to the memory module 608, may send a physical memory address (from the MMU 604) to the memory module 608 to read a "word" of data. The size of the word is platform dependent: for example, a 64-bit computing device may have a word size of 8 bytes. Furthermore, the size of the memory address sent by the memory module 608 is also platform dependent. A memory controller 605 in a 64-bit computing device may request a word of data with a 64-bit address. Furthermore, the memory controller 608 may receive the requested word of data from the memory module 608 in a cache line of data, which may comprise the smallest unit of memory transferred between main memory of the memory module 608 and the cache 603. For example, the cache line may be 64 bytes of data (e.g. include the word and include a portion of contiguous surrounding data).

The processor 602 may communicate with the memory module 608 over a wire interface. In conventional computing devices, the wire interface may support a low-level wire protocol as described below. In embodiments of the present invention, the wire interface may comprise a QuickPath Interconnect ("QPI") point-to-point processor interface by Intel® with a plurality of point-to-point data links. The wire interface, in another embodiment, is a HyperTransport point-to-point processor interface.

The processor 602 may communicate with the IO module 610. The IO module 610 may support and communicate with the BIOS module 612, the network module 614, the PCIe module 616, the storage module 618, and other components as is known in the art. The BIOS module 612 may communicate instructions through the IO module 610 to boot the computing device 600. Alternatively, the BIOS module 612 may comprise a coded program embedded on a chipset that recognizes and controls various devices that make up the computing device 600. The network module 614 may communicate with the IO module 610 to allow the computing device 600 to communicate with other devices over a network.

Computer readable programs may be stored in non-volatile storage on the storage module 618. The storage module 618 may include a hard disk drive, an optical storage device, a holographic storage device, a micromechanical storage device, a solid-state storage device 102 described above in relation to FIGS. 1-5, and the like. A solid-state storage device 102 such as that described above, may also communicate with the IO module 610 through the PCIe module 616 using a PCIe bus.

In conventional computing devices, the memory module 608, or "main memory," includes volatile memory such as dynamic random access memory ("DRAM") and static random access memory ("SRAM"). Specifically, the memory module 608 may include one or more storage media, such as one or more dual in-line memory modules ("DIMM"s) of volatile memory. Each DIMM may comprise a series of volatile memory integrated circuits. As stated above, the processor 602 communicates with the memory module 608 (with the volatile memory) over a wire interface by way of a protocol 606. Furthermore, in conventional computing devices, the processor 602 may communicate with the volatile memory by way of a low-level wire protocol 606 such as the Joint Electron Devices Engineering Council ("JEDEC") protocol.

JEDEC has been the industry standard for processor—DRAM interfaces. The JEDEC standard assumes that physically addressable media is synchronous, heavily parallel, reliable and implements a design structure that is known to the memory controller 605. Consequently, JEDEC uses a series of distinct commands, PRECHARGE, RAS, CAS, that cause the DRAM devices to execute known operations in hardware.

Even with some of the new, disruptive non-volatile memory technologies like Flash Memory, Phase Change Memory ("PCM") and Spin-Torque Transfer Memory ("STT-RAM") in play for replacing DRAM, or other volatile memory, as main memory, the JEDEC standard is still being considered the standard of choice for accessing main memory that includes devices of these memory types. This means that although the unique properties of the device may lend itself to a different physical or board level arrangement (due to access times, byte/block address-ability, read/write/erase capabilities, and wear out properties) the arrangement of these macroscale devices must still comply with the sub-optimal JEDEC standard. The assumption of the JEDEC standard has tied most studies for main memory replacements to technologies that have performance and reliability characteristics close to traditional DRAM.

Recently, there has been significant development of flash-based devices—a technology generally considered too unreliable for a main memory replacement—that are capable of operating on the PCIe bus, such as the solid-state storage device 102 described above. While these devices may export a traditional block device interface such as the block I/O emulation layer 508 described above in relation to FIG. 5, advances in the logical-to-physical translation layer 512 no longer require these devices to be connected to the low speed, long latency DMI and SATA busses which currently limit bandwidth to a maximum of 2 GB/s. In enterprise systems, the PCIe bus is moving further and further away from the processor 602, in terms of wire length, and communication between the processor 602 and the PCIe bus involves multi-hop protocols utilizing external DMA transfer engines, PCIe lane sharing which multiplexes multiple devices onto a single lane, and virtualization that requires additional hardware protection modules. While bandwidth rates are maintained, current NAND flash devices have an access time of approximately 50 μ, but even the highest performing devices have access latency of approximately 250 μ due to the multi-hop protocols required to reach the device.

This 4:1 overhead to access current NAND and other non-volatile memory technology is due primarily as a result of using legacy software interfaces within the operating system that require heavyweight operations such as context switching away from the user application into the kernel, traversing a heavyweight DMA setup process and then waiting for the asynchronous DMA operations to occur, a multi-hop operation requiring a minimum of 6 on/off chip accesses.

Conventional DRAM devices have an access time of approximately 10 ns. Yet even with only a single socket addressing the DRAM subsystem, the total round trip time for a processor 602 to access main memory is on the order of 100-200 ns. Control logic overhead, queuing delays, and off-chip wire delay are more expensive operations than the actual device latency. In multi-socket Non-Uniform Memory Access ("NUMA") memory models, this disparity becomes even greater. NUMA memory models involve multiprocessors in which each processor has a local main memory but can also access the main memory local to other processors (e.g. a memory controller of one processor is connected to a memory controller of another processor via Hypertransport or QPI links). As a result, main memory access time from a particular processor depends on the distance between the particular processor and the main memory it accesses, with faster access times being those for processors physically closer to main memory.

NUMA memory model computer systems with large amounts of main memory are currently available such as 1024 cache-coherent non-uniform memory access ("CC-NUMA") machines where 1terabyte ("TB") of DRAM is standard and accessible via the traditional memory controller interface. In these machines, a single memory access can traverse as many as 64 Hypertransport or QPI links before arriving at the on chip memory controller which is physically attached to the DRAM device to be accessed. As a result, the wire delay to access main memory can grow into the 10's of μ scale, while actual DRAM device access time remains only 10 ns.

Certain processors have recently incorporated multiple memory controllers ("MC"s), with each memory controller controlling a distinct subset of the total main memory physical address space. As described below, a computing device may use multiple "on-chip" memory controllers to deviate from the JEDEC standard and access high bit density technologies, such as the non-volatile memory types described above, that reduce the need for complex long wire traversals in exchange for local, albeit slower, amounts of local memory. Because the main memory interface is synchronous, latency, not bandwidth is often the limiting factor to application throughput.

Figure 7:
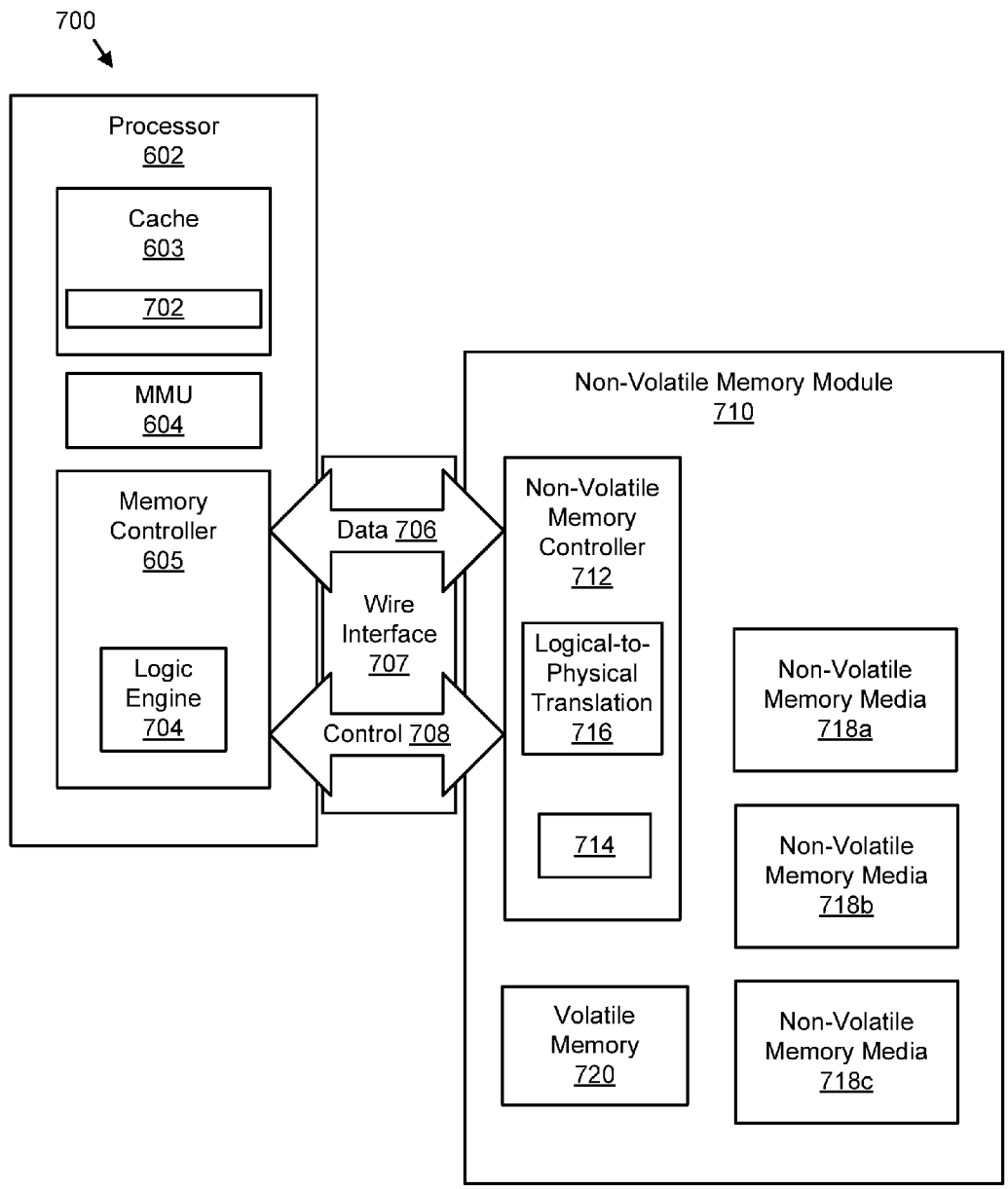
FIG. 7 is a schematic block diagram illustrating one embodiment of a system with direct interface between a memory controller and non-volatile memory in accordance with the present invention.

FIG. 7 illustrates one embodiment of a system 700 for a direct interface between a memory controller 605 and non-volatile memory in accordance with the present invention. FIG. 7 refers to elements of FIG. 6, like numbers referring to like elements. FIG. 7 includes a processor 602 in communication with a non-volatile memory module 712. The processor includes a cache 603 with a cache line 702, an MMU 604, and a memory controller 605 with a logic engine 704. The memory controller 605 communicates, by way of a data path 706 and a control path 708 of a wire interface 707, with a non-volatile memory controller 712 in the non-volatile memory module 710. The non-volatile memory controller 712 includes a logic engine 714 and a logical-to-physical translation layer 716. In addition, the non-volatile memory module 710 includes non-volatile memory media 718a-c and a volatile memory buffer 720.

As described above, the processor 602 may be a multiprocessor having one or more cores. The processor 602 includes a cache 603 as described above. The cache 603, in the depicted embodiment, includes a cache line 702. In certain embodiments, the processor 602 includes multiple caches 603 and may include multi-level caches with such as a Level 0 ("L0") cache, Level 1 ("L1") cache, Level 2 ("L2") cache, Level 3 ("L3") cache, and the like. As is known in the art, with a multi-level cache, the processor 602 may sequentially check each cache level for cached data starting with the smallest and fastest cache (such as L1 cache). As described above, the processor 602 may include an MMU 604 that translates logical memory addresses from a client to physical memory addresses that, in conventional computing devices, correspond to physical locations on one or more of the storage media of main memory. The physical memory addresses from the MMU 604 may be communicated to the non-volatile memory module 710 by the memory controller 605, which is described below.

The non-volatile memory module 710 may support, house, and/or provide access to one or more non-volatile memory media devices 718a-c. In one embodiment, the non-volatile memory module 710 includes all or a portion of the functionality described above in relation to the solid-state storage device 102 for reading data, writing data, storage space recovery, and the like, except that the non-volatile memory module 710 reads and writes data in a main memory context, not a storage context. For example, the non-volatile memory module 710 through the non-volatile memory controller 712 may be configured to operate memory maintenance functions on the non-volatile memory media 718 to optimize non-volatile memory module 710 performance. These memory maintenance functions may include, but are not limited to storage space recovery, error correcting code ("ECC"), log-based sequential storage, and wear-leveling as described above in relation to the solid-state storage device 102 and solid state storage controller 104 and as described below specific to using the non-volatile memory module 710 for memory. The non-volatile memory module 710 includes a logical-to-physical translation layer 716 that is similar in concept to the logical-to-physical translation layer 512 described above in relation to FIG. 5, except that the logical-to-physical translation layer 716 depicted in FIG. 7 treats physical memory addresses from the MMU 604 (e.g. what the MMU 604 assumes are physical addresses pointing to locations on the media) as logical memory addresses, translating these into physical media addresses specifying locations on the non-volatile memory media. The logical-to-physical translation layer 716 is described in further detail below.

The non-volatile memory module 710 includes non-volatile memory media 718. The non-volatile memory media may include flash memory, nano random access memory ("NRAM"), magneto-resistive RAM ("MRAM"), dynamic RAM ("DRAM"), phase change RAM ("PRAM"), Racetrack memory, Memristor memory, nanocrystal wire-based memory, silicon-oxide based sub-10 nanometer process memory, graphene memory, Silicon-Oxide-Nitride-Oxide-Silicon ("SONOS"), Resistive random-access memory ("RRAM"), programmable metallization cell ("PMC"), and conductive-bridging RAM ("CBRAM").

Non-volatile memory, such as flash, has substantially better bit density than DRAM and average power characteristics. For example, 1 TB of DRAM based main memory organized as 512×2 GB DIMMS will consume almost 1 KW of power (4.7 W/DIMM). As a result, CC-NUMA machines must distribute these modules across a large rackspace to satisfy power and cooling constraints. Modern NAND flash devices can deliver 1.28 TB of storage in as little as 25 watts.

In addition, conventional computer systems are architected such that all storage must be first loaded into main memory (typically via DMA) before the processor 602 can access that data. This is done in chunks as large as Megabytes, but never any smaller than the native block size of the device, typically 512 B or larger. This initial copy (called a Von Neumann copy) to a volatile memory structure is inherently an energy inefficient method of accessing data, if not all 512 B are going to be used. Providing direct access to large volumes of persistent storage removes the need for the implicit copying that occurs in Von Neumann architectures.

Current non-volatile memory technologies have inherently lower bandwidth than DRAM devices. Current state of the art Flash (such as NAND) based designs can saturate a 1 GB/s link with 24 pipelined transactions. To achieve bandwidth on parity with modern DRAM systems, in one embodiment, multiple non-volatile memory devices may be used in a channel based arrangement similar to DRAM devices today. Advantageously, these lower bandwidth links also require less on chip pins, so the absolute number of off-chip pins may drop or at least remain unchanged.

In addition, non-volatile memory technologies are inherently asymmetric. Read and Write (a combination of erase+write in many cases) have very different latency and power properties. While write buffering and other techniques reduce this impact, too many writes to the non-volatile memory subsystem, such as media 718, could lead to performance degradation. However, as described below, non-volatile memory modules 710 may co-exist alongside traditional volatile memory modules where a client, such as the operating system, may chose to map read only pages onto the non-volatile memory physical address space. Over 95% of an application's footprint in memory may be read only even in 8 and 16 core multi processor systems.

As described above, after a limited number of writes to a non-volatile memory physical memory cell, the cell can no longer be erased and re-written. For modern NAND flash MLC cells, this number is currently about 3000. To avoid wearing out the physical media, memory device manufactures may implement a logical to physical mapping layer as described above, and use over-provisioning and other techniques. This translation can happen at near line-speeds and is effective enough that even by constantly writing to a modern flash device at a full 1 GB/s, many flash device manufacturers guarantee that a flash device will not wear out in any less than 5 years.

Furthermore, future technologies are expected to have improved wear-out capabilities, increasing future data integrity with non-volatile memory behind a near line-speed flash translation layer. Operating system intelligence in placing write-heavy pages on volatile memory modules for performance reasons will have the added benefit of improving the non-volatile memory module's 710 wear-out prevention capabilities.

In addition, the non-volatile memory module 710 may include spare non-volatile memory devices. As described below, the non-volatile memory module 710 may signal the memory controller 605, by communicating memory attributes as described below, that the non-volatile memory media 718 currently in use has reached a predetermined amount of wear and/or is exhibiting certain performance characteristics. The memory controller 605 may signal the operating system, which may alert a user and/or refrain from performing subsequent memory operations (e. g. wear intensive operations such as writing or erasing) on the non-volatile memory module 710. In the meantime, the non-volatile memory module 710 may copy the data from the affected non-volatile memory media 718 to the spare memory devices. In some embodiments, the user may switch out the worn memory devices for spare memory devices. Additionally, memory devices of the non-volatile memory module 710 may be swappable, interchangeable, and/or replaceable. The non-volatile memory module 710 may have one or more open memory device slots. A user may plug-in an additional memory device into an open slot. The non-volatile memory module 710 may copy data from a selected memory device (such as a worn memory device) to the additional memory device. The user may then remove the selected memory device. In one embodiment, memory devices of the non-volatile memory media 718 in the non-volatile memory module 710 are "hot swappable," meaning that the non-volatile memory module 710 and/or the processor 602 does not need to be shut down before adding or removing memory devices.

The non-volatile memory module 710 may be in communication with the processor 602 over the wire interface 707. In certain embodiments, instead of only connecting processor memory controllers together using QPI point-to-point processor interfaces or HyperTransport point-to-point processor interfaces, the wire interface 707 between the memory controller 605 and the non-volatile memory module 710 may include a QPI point-to-point processor interface, a HyperTransport point-to-point processor interface, or other similar wire interface. Consequently, in one embodiment, the wire interface 707, in addition to supporting a low level, wire interface specific communication as conventional wire interfaces, the wire interface 707 includes a data path 706 and a control path 708 to communicate data and commands between the memory controller 605 of the processor 602 and the non-volatile memory controller 712.

The memory controller 605 communicates with, is coupled to, and/or integrated with the processor 602. The memory controller 605 manages data communication between the processor 602 and the non-volatile memory module 710. For example, the memory controller 605 may send a physical memory address to the non-volatile memory module 710 as part of a read request. As described above, in conventional computing devices, the memory controller 605 may communicate with a volatile memory module using the JEDEC protocol. However, in the depicted embodiment, the memory controller 605 includes a logic engine 704 that supports communication over the wire interface 707 to non-volatile memory. In one embodiment, the logic engine 704 includes logic to enable the memory controller 605 to communicate over the wire interface 707 by way of a command protocol. The command protocol enables greater communication flexibility in comparison to a wire protocol, providing for a wider variety of information that the wire interface 707 may communicate and providing for more methods of communication. Specifically, the memory controller 605 may take advantage of wire interface technology (e.g. QPI or Hypertransport) typically used to connect a processor memory controller to another processor memory controller, to, instead of communicating bit addresses and signals as part of the JEDEC standard, prepare data operation and control commands and then communicate (send and receive) data operation commands and control commands, communicate variables, and/or communicate memory management metadata by way of the command protocol as described below.

While the JEDEC standard includes commands, PRECHARGE, Row Address Strobe (RAS), Column Address Strobe (CAS), JEDEC combines commands with a physical wire protocol into one specification such that limitations of the wire interface are inherently embedded into the JEDEC standard. For example, the coupling of commands with the wire interface under JEDEC protocols requires that a memory controller and the memory device that the memory controller communicates with adhere to specific physical connection parameters. For example, the memory device (such as a DRAM DIMM) must operate at a given value or range of values for voltage, frequency, and impedance defined by the JEDEC protocol for the wire interface.

Additionally, because of this inter-relationship between the wire interface and the JEDEC commands, memory devices that satisfy the JEDEC memory communication protocol suffer from the STUB electronics problem. The STUB electronics problem limits the maximum number of memory devices that can be connected over the wire interface (e.g. the JEDEC standard bus) to avoid noise interference due to each added memory devices operating like an antenna.

In addition, because the operation of the connected memory device has become so standard and well understood during the development of the JEDEC standard memory communication protocol, even certain JEDEC commands have been influenced by the electronic characteristics of the memory devices. For example, the PRECHARGE command is a command that initiates a voltage charge in the memory device and has a set minimum latency threshold that dictates when a subsequent command can be sent.

In contrast, the memory controller 605 and non-volatile memory controller 712 keep the command protocol and the physical wire protocol separate, which provides improved flexibility. The physical limitations of the wire interface do not affect the command protocol. Specifically, the same command protocol may support multiple wire interfaces 707 or alternative wire interfaces 707 and because the memory controller 605 and non-volatile memory controller 712 may report-back/query the performance and/or characteristics of the wire interface 707, no assumptions about the limitations of the wire interface are inherently embedded in the command protocol. The logic engine 704 may interpret and/or generate data bit patterns according to the command protocol. The logic engine 704 comprises the logic needed to decouple the command protocol and the wire interface 707. For example, the logic engine 704 may be configured to handle re-transmission of commands, out-of-order command processing, or other higher level communication tasks that enable the data path 706, control path 708 and wire interface 707 to be de-coupled.

The non-volatile memory controller 712 may manage, facilitate, and/or perform memory operations on the non-volatile memory media 718a-c in the non-volatile memory module 710. The non-volatile memory controller 712 may be coupled to, in communication with, and/or integrated with the non-volatile memory media 718a-c. The non-volatile memory controller 712 may implement all or a portion of the solid-state storage device 102 functionality as described above, including operating memory maintenance functions such as storage space recovery, ECC, and wear-leveling described in more detail below. In certain embodiments, the non-volatile memory controller 712 may be configured to detect and replace certain storage media that fails to meet a performance threshold. Specifically, the non-volatile memory controller 712 may copy data from the certain storage media to one or more additional storage media such as a parity storage element (e. g. a device or chip), a reserved storage element, a backup or redundant storage element, and the like. The non-volatile memory controller 712 may then map storage operations to the replacement storage media instead of the certain storage media.

In addition, the nonvolatile memory controller 712 may include similar data storing functionality as the solid-state storage controller 104. Specifically, in one embodiment, the non-volatile memory controller 712 is configured to store data on the non-volatile memory media 718 using a sequential log-based storage format described below. The non-volatile memory controller 712 may also implement, maintain, and/or manage the logical-to-physical translation layer 716 described below. The functionality of the non-volatile memory controller 712 may be implemented in firmware, hardware logic, and/or software in the non-volatile memory module 710.

The non-volatile memory controller 712 may receive commands from the memory controller 605. As described above, in conventional computing devices, the memory controller 605 communicates with main memory using the JEDEC protocol. However, in the depicted embodiment, the non-volatile memory controller 712, like the memory controller 605, includes logic 714 (that may be embodied in certain embodiments by the modules described below) that supports communication over the wire interface 707 to the memory controller 605 by way of the command protocol.

In one embodiment, the data path 706 communicates data between the memory controller 605 and the non-volatile memory controller 712. Specifically, the data path 706 may communicate a 64-byte cache line of data containing a word of data requested by the memory controller 605. By separating the control path 708 and the data path 706 the bandwidth for the data path 706 over the wire interface 707 is maximized. In certain embodiments, the separation of these paths 706, 708 permits the data to flow on the data path at line-speed (the same speed as the clock cycles that operate the wire interface 707). In one embodiment, the data path 706 and control path 708 may co-exist on the wire interface 707 using a multiplexor to distinguish between information related to the data path 706 and information related to the control path 708.

In one embodiment, the control path 708 communicates data operation commands between the memory controller 605 and the non-volatile memory controller 712. Data operation commands may include, but are not limited to data read requests, data write requests, and the like. In addition, a data operation command, in one embodiment, contains a physical memory address from the MMU (treated as a logical memory address by the non-volatile memory controller 712). For example, the memory controller 605 may send a 64-bit memory address over the control path 708 in a data operation command to request a word of data from the non-volatile memory module 710. Similarly, the control path 708 may also communicate a response from the non-volatile memory controller 712. Specifically, the response may include a confirmation of a successful write.

For example, the control path 708 may communicate a data operation command from the memory controller 605 requesting a word of data and containing a 64-bit physical memory address. The data path 706 may subsequently communicate data with the requested word embedded in a 64-byte cache line. In one embodiment, the memory controller 712 requests a word of data at a time. However, the command protocol, in some embodiments, allows the memory controller 712 to request and receive amounts of data not limited to a word. In one embodiment, the memory controller 712 may request a plurality of words of data, or another unit of data.

The control path 708 may also communicate control commands between the memory controller 605 and the non-volatile memory controller 712. Control commands may include memory management commands such as deallocation commands, described below, which notify the non-volatile memory controller 712 that certain data does not need to be preserved (similar to the Trim command). Memory management commands may also include requests for memory attributes from the non-volatile memory module 710. Memory attributes provided by the non-volatile memory module 710 may include attributes, characteristics, and/or a status of the non-volatile memory media 718a-c. Memory attributes may also include memory performance attributes and memory wear-out attributes. For example, the memory attributes may specify that a particular non-volatile memory module 710, a particular non-volatile memory media 718, or a particular section (e.g. an LBA) on non-volatile memory media 718 is experiencing excessive wear. In addition, certain non-volatile memory media devices 718a-c may have differing characteristics from other non-volatile memory media devices 718a-c. The memory controller 605 may distinguish among different non-volatile memory media devices 718a-c based on memory attribute information conveying characteristics of each non-volatile memory media devices 718a-c.

As described above, in one embodiment, the non-volatile memory module 710 includes spare (such as for example replacement) non-volatile memory devices. Spare non-volatile memory devices may already be installed in the non-volatile memory module 710 and may not be used until needed. Alternatively, spare non-volatile memory devices may be installed in the non-volatile memory module 710 either in open slots or to replace existing non-volatile memory devices when needed. Specifically, in certain embodiments, the non-volatile memory controller 712 may be configured to detect and replace certain storage media that fails to meet a performance threshold. The non-volatile memory controller 712 may communicate to the memory controller 605, through the control path 708, that a memory device has reached a predetermined amount of wear and/or is exhibiting certain performance characteristics. The memory controller 605 may signal the operating system, which may alert a user and/or refrain from performing subsequent memory operations on the non-volatile memory module 710. In the meantime, the non-volatile memory module 710 may copy the data from the affected memory devices to the spare/replacement memory devices. The non-volatile memory controller 712 may then map future storage operations to the spare/replacement storage media instead of the worn memory devices. In some embodiments, the user may switch out the worn memory devices for the replacement memory devices. Specifically, as described above, memory devices 718a-c of the non-volatile memory module 710 may be swappable, interchangeable, and/or replaceable. The non-volatile memory module 710 may have one or more open memory device slots. A user may plug-in an additional memory device 718c into an open slot. The non-volatile memory controller 712 may copy data from a selected memory device 718a (such as a worn memory device) to the additional memory device 718c.

In one embodiment, the non-volatile memory controller 710 sends memory attributes in response to a query command requesting attributes from the memory controller 605. For example, a client such as an operating system may request a wear-out status of a non-volatile memory module 710. The operating system communicates the request to the memory controller 605, which then communicates the request over the control path 708. The non-volatile memory controller 710 may respond with a status of the non-volatile memory media 718a-c in the form of memory attributes communicated over the control path 708. In one embodiment, the non-volatile memory controller 712 communicates memory management metadata at a predetermined interval. The depicted embodiment depicts a distinct data path 706 and control path 708 (the data and the data and control commands may transmit over different wires or groups of wires). In one embodiment, the data and the commands communicate over distinct paths for performance reasons. For example, control commands may have a lower priority than data. In other embodiments, the wire interface 707 may communicate the data and the commands over a common path (a common wire or groups of wires) and the data and commands may be distinguishable by way of a multiplexor.

The total time to access a traditional non-volatile memory device is dominated by both the software overheads of using legacy block device interfaces, and the wire delay to traverse multiple bridges and the long wires required that allow physical access to the off-chip devices. Removing the trap to a software routine and allowing these devices to be accessed as part of the 64-bit physical address space, rather than within the storage address space, will remove as much as 50% of the total device access latency. Moving access to these devices from the long and complex PCIe bus, to a processor direct connected interface can reduce the physical propagation delay by as much as 30%. Overall, moving to a processor direct interface has the potential of reducing total access latency to non-volatile memory technology by over 75%.

The non-volatile memory module 710 includes a volatile memory buffer 720 that, in one embodiment, stores a copy of data structures used to implement the logical to physical translation layer 716 described below.

Figure 8:
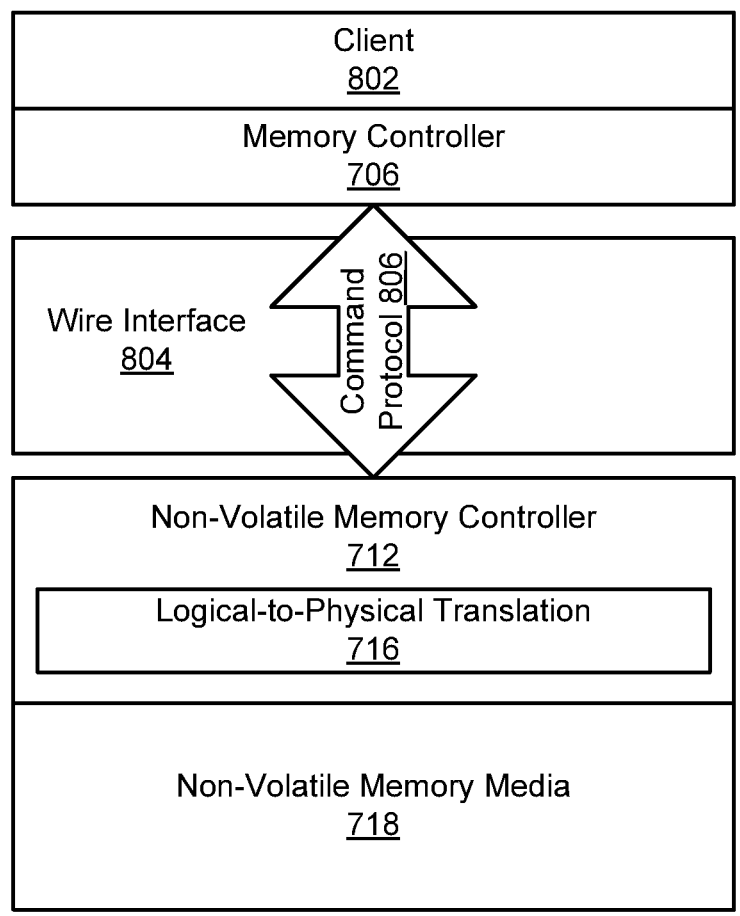
FIG. 8 is a schematic block diagram illustrating a logical representation of one embodiment of a plurality of communication layers between a client and non-volatile memory in accordance with the present invention.

FIG. 8 illustrates a logical representation of one embodiment of a plurality of communication layers 800 between a client 802 and non-volatile memory media 604 in accordance with the present invention. FIG. 8 refers to elements of FIG. 6 and FIG. 7, like numbers referring to like elements. FIG. 8 depicts a client 802, the memory controller 706, a wire interface 804, a command protocol 806 over the wire interface 804, the non-volatile memory controller 712, the logical-to-physical translation layer 716, and the non-volatile memory media 718. The client 802 initiates data reads and writes to the processor 602 for the non-volatile memory media 718. Representative examples of clients 802 include, but are not limited to, one of or a combination of, a server, a file system, an operating system, an MMU 604, a processor 602 (multiprocessor), and the like. The wire interface 804 may be similar to the wire interface 707 described in relation to FIG. 7, comprising a QPI or HyperTransport point-to-point interface. The wire interface 707 may also support a data path 706 and a control path 708 as described in FIG. 7. The command protocol 806 may also be similar to the command protocol described above. The logical-to-physical translation layer 716 may map logical memory addresses (typically assumed by the memory controller 605 to be physical memory addresses) contained in the commands from the memory controller 706 to physical media addresses indicating physical storage memory locations in the non-volatile memory media 718.

As described above, in conventional computing devices, the address used at the memory controller 706 and used to access DRAM is called the physical address. Therefore, the physical address sent by the memory controller 706 to the main memory references a physical location on the DRAM. Due to wear-out issues with non-volatile memory, in various embodiments, a client 802 such as the operating system, the memory controller 706, and/or the non-volatile memory module 710 may control wear-out properties. In one embodiment, wear leveling and other advanced techniques to improve the raw performance of these non-volatile memory is controlled at the device level in the non-volatile memory module 710. The non-volatile memory module 710 may present a linear contiguous address space to the client, underneath which a second layer of translation may occur before accessing the non-volatile memory media 718.

The logical-to-physical translation layer 716 may be similar in concept to the logical-to-physical translation layer 512 described above for the storage controller 506 in relation to FIG. 5. Specifically, the logical-to-physical translation layer 716 provides a level of abstraction between the physical memory addresses used by the memory controller 706 (obtained from the MMU 604), and physical media addresses, or addresses that specify physical locations at which the non-volatile memory controller 712 stores the data. Consequently, a logical address sent by the client 802 may undergo two address translations: being translated at the MMU 604 in the processor 602 to a physical memory address (used to locate data on the physical media in conventional computing devices), and then being translated again at the logical-to-physical translation layer 716 from the physical memory address to a physical media address indicating the location of the data on the non-volatile memory media 718.

This mapping allows data to be referenced in a logical address space on the non-volatile memory media 718, treating the physical memory addresses as logical identifiers. A logical identifier does not indicate the physical location of data on the non-volatile memory media 604, but is an abstract reference to the data.

The non-volatile memory controller 712 manages the actual physical address space and may divide the physical address space into smaller units such as logical pages ("LP"s), logical erase blocks ("LEB"s), ECC chunks, packets, blocks, sectors, and the like, similar to the solid-state storage device 110 as described above. In one embodiment, the non-volatile memory controller 712 divides the physical address space into units of the same size as the cache line 702. For example, the non-volatile memory controller 712 may maintain LEBs of cache-line sized memory units such that a memory unit, at its smallest form, may does not span LEBs or other similar logical structures.

Furthermore, in one embodiment, like the logical address space presented by the solid-state storage device 102, the logical address space presented by the non-volatile memory controller 712, is substantially larger than the actual physical address space. This "thinly provisioned" or "sparse address space" embodiment, allows the number of logical identifiers for data references to greatly exceed the number of possible physical addresses. Specifically, the non-volatile memory controller 712 may be configured to store data sequentially, using a log-based append-only writing process, similar to the storage controller 506 described above in relation to FIG. 5. Specifically, the non-volatile memory controller 712 may sequentially write data on the non-volatile memory media 718 in a log structured format and use a storage space recovery process that re-uses data storage cells as described below to provide sufficient storage capacity.

In one embodiment, the logical-to-physical translation layer 716 includes a map or index, similar to index of the solid-state storage device 102, except that it may map physical memory addresses to physical media address. The map may be in the form of a B tree, a content addressable memory ("CAM"), a binary tree, and/or a hash table, and the like described below. In certain embodiments, the logical-to-physical translation layer 716 is a tree with nodes that represent physical memory addresses, associating corresponding physical media addresses. In one embodiment, each node represents a contiguous range of physical memory addresses to minimize tree size.

As stated above, in computing devices with conventional main memory, a physical memory address maps directly to a particular physical location in the main memory. A client 802 communicating with this conventional main memory typically deletes data in main memory by overwriting data for a particular physical memory address. In addition, due to the volatile nature of conventional main memory, when the main memory is powered off, the data is cleared.

Conversely, when a client 802, such as a processor 602, communicating with a non-volatile memory module 710 having a logical-to-physical translation layer 716, no longer needs data, the corresponding physical media addresses may remain allocated on the non-volatile memory media 718. For example, a processor 602 executing an application using one or more pages stored on the non-volatile memory media 604, may close the application. The data corresponding to the pages stored on the non-volatile memory media 604 are no longer needed. However, the non-volatile memory controller 712 may still preserve the relationship between physical memory addresses for the pages and the corresponding physical media addresses.

In certain embodiments, the non-volatile memory controller 712, similar to the storage controller 506 above, is configured to store data on the non-volatile memory using log-based storage and configured to recover storage space on the non-volatile memory media 718 using a storage space recovery process. Like the storage controller 506, the non-volatile memory controller 712 may include a similar storage space recovery, or garbage collection process that re-uses data storage cells to provide sufficient storage capacity. The storage space recovery process reuses storage cells for storage units marked as deallocated, invalid, unused, or otherwise designated as available for storage space recovery in the logical-to-physical translation layer 716. The storage space recovery process may also preserve storage units that the non-volatile memory controller 712 specifies as valid.

Similar to the storage controller 506, the non-volatile memory controller 712 expends resources and overhead in preserving data in valid memory units. Therefore, memory units corresponding to deleted pages may be unnecessarily preserved by the non-volatile memory controller 712. Furthermore, due to the inherent transient nature of data in main memory, the performance of the non-volatile memory module 710 may suffer if it retains unneeded memory units.

As stated above, some storage devices 102 are configured to receive messages or commands, such as the Trim command, notifying the storage device 102 of unused logical blocks so that the storage device 102 may deallocate the corresponding physical blocks. In one embodiment, the non-volatile memory controller 712 is configured to receive a deallocation command similar in concept to the Trim command. Specifically, the memory controller 706 may communicate a deallocation command over the control path 708 by way of the command protocol 806, notifying the non-volatile memory controller 712 of physical memory addresses that the client no longer needs. In one embodiment, the client 802 issues the deallocation command, notifying the memory controller 706 of the memory addresses for one or more pages of data that may be deallocated. For example, the client 802 may evict one or more pages of data from cache. The MMU 604 translates these page memory addresses into the corresponding physical memory addresses and communicates the deallocation command over the control path 708 with the corresponding physical memory addresses. The non-volatile memory controller 712 may then deallocate the corresponding memory units for those addresses by removing nodes in the logical-to-physical translation layer map, tree or index. Specifically, in one embodiment, the logical-to-physical translation layer 716 comprises a tree with nodes representing contiguous physical memory addresses with each node providing an indicator of the location of corresponding data on the non-volatile memory media 718. In this embodiment, the presence of a node including a particular physical memory address indicates that the physical memory address has data stored on the non-volatile memory media 718. Similarly, if a physical memory address has no corresponding node, the physical memory address is not assigned. Therefore, by removing and/or modifying a node in the tree to eliminate a physical memory address, the data corresponding to the physical memory address is freed.

Figure 9:
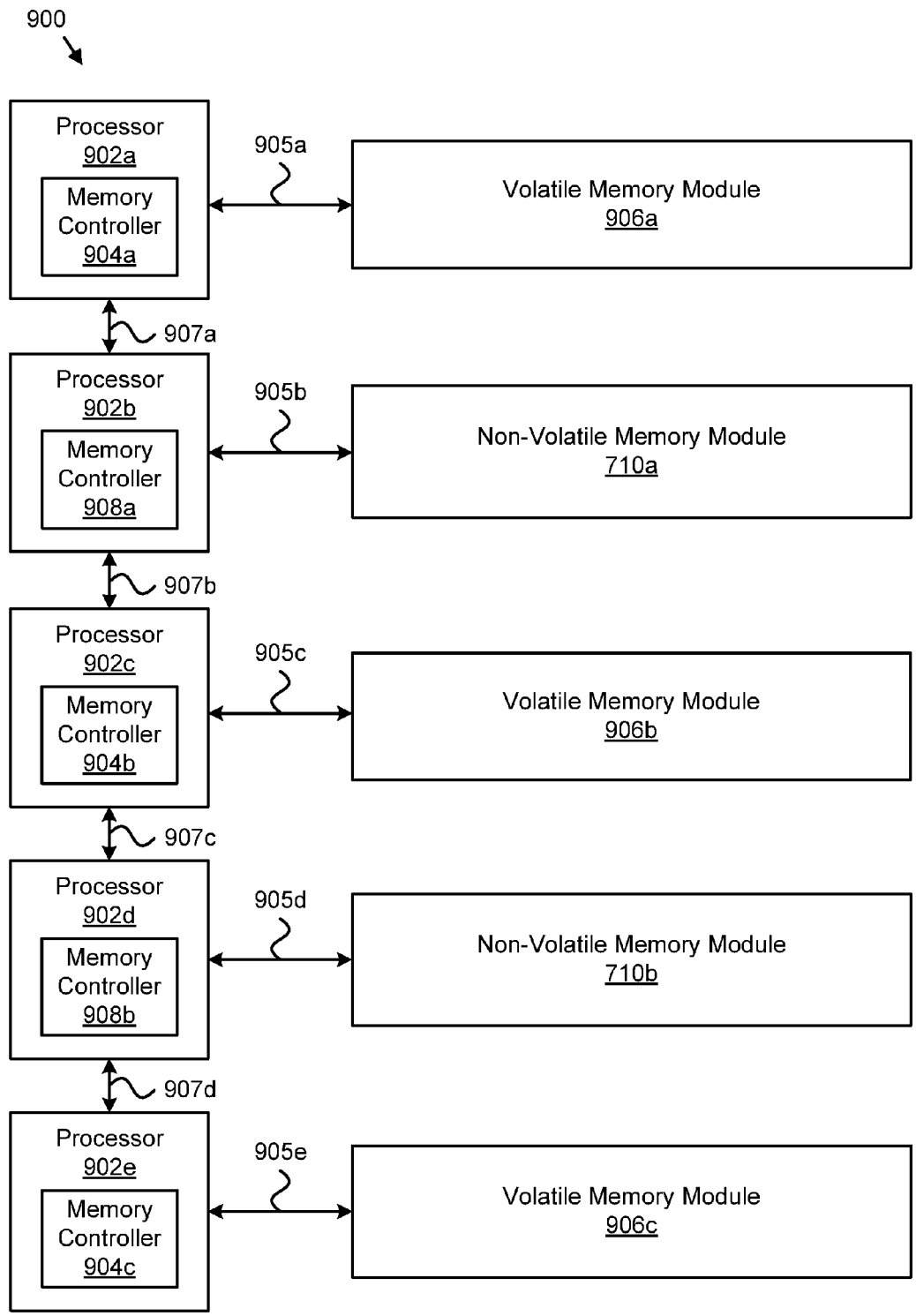
FIG. 9 is a schematic block diagram illustrating one embodiment of a system with a plurality of memory controllers communicating with a plurality of memory modules in accordance with the present invention.

FIG. 9 is a schematic block diagram illustrating one embodiment of a system 900 with a plurality of memory controllers 904, 908 communicating with a plurality of memory modules 906, 710 in accordance with the present invention. Specifically, FIG. 9 depicts a system 900, as mentioned above, in which volatile memory modules 906 co-exist with non-volatile memory modules 710. In the depicted embodiment, a first plurality of memory controllers 904 communicate with volatile memory modules 906 over a plurality of wire interfaces 905. Each wire interface 905 may be similar to the wire interface 606 described in relation to FIG. 6. In one embodiment, the first plurality of memory controllers 904 communicate by way of a protocol optimized for volatile memory module management such as the JEDEC protocol or a Rambus (RDRAM or Direct RD-RAM) protocol. The volatile memory module 906 may house and provide access to volatile memory media. The volatile memory media may include DRAM, SRAM, and the like.

In the depicted embodiment, a second plurality of memory controllers communicate 908 with non-volatile memory modules 710 over a plurality of wire interfaces 905. Each of the second plurality of memory controllers 908 may be similar to the memory controller 605 in FIG. 7 Likewise, each of the non-volatile memory modules 710 may be similar to the non-volatile memory module 710 in FIG. 7. In addition, the second plurality of memory controllers 908 may communicate by way of the command protocol 806 described above in relation to FIGS. 7 and 8. In one embodiment, the amount of second memory controllers 908 is less than the amount of first memory controllers 904, and similarly the amount of non-volatile memory modules 910 is less than the amount of volatile memory modules 906.

In the depicted embodiment, the processors 902 are in communication with one another over an inter-processor interface 907 between processors 902. The inter-processor interface 907 may also allow communication between memory controllers 904. Consequently, memory accessible to a particular memory controller 904a is also accessible to other processors 902b, 902c. In one embodiment, the inter-processor interface comprises a QuickPath Interconnect ("QPI") or HyperTransport point-to-point processor interface.

In one embodiment, the first memory controllers 904 and the second memory controllers 908 present a single logical address space to a client 802. In some embodiments, the client 802, such as an operating system, is aware of the boundaries in the address space that divide volatile memory modules 906 and non-volatile memory modules 710. In another embodiment, the first memory controllers 904 may present a first logical address space and the second memory controllers 908 may present a second logical address space. The client 802 may differentiate the type of main memory using the separate address spaces. Furthermore, the client 802 may direct data to memory divisions in the volatile memory and/or the non-volatile memory or to volatile or non-volatile memory modules based on various memory attributes. The non-volatile memory media 718 may be divided into memory divisions, which are physical or logical units of memory including pages, erase blocks, media banks, channels or the like. For example, in one embodiment, memory attributes may include a writing frequency and/or a reading frequency of data pages directed toward main memory, power use characteristics, persistence characteristics, and/or performance characteristics. These memory characteristics may be communicated by way of the command protocol 806 on the control path 708 (See FIG. 7).

Currently, the support of operating systems and memory controllers for NUMA systems is rudimentary. Support exists simply by attempting to map memory pages being requested via a processor onto the physical NUMA node that exists "nearest" to that processor socket. In the depicted embodiment, in addition to the memory controller utilization being a first class scheduling primitive, an operating system may be aware of the exported access times and wear out properties from the non-volatile memory modules 910. For example, most non-volatile memory technologies have write times that have 2-10× longer latency than their respective read access times. For optimal page placement to occur, this imbalance may be recognized by a client such as the operating system, so that write heavy pages are migrated away from write-unfriendly non-volatile memory modules 910 onto write-friendly volatile memory modules 906. Similarly some pages may be very sensitive to read latency and page-migration between non-volatile memory modules 910 may optimize application throughput. By far, the majority of operating system pages allocated are read only. In one embodiment, the high density (read-optimized) non-volatile memory NUMA capacity is optimized against the (write-friendly) volatile NUMA capacity. For example, in one embodiment, the ratio of volatile memory modules 906 to non-volatile memory modules 910 is 1:2. In another embodiment, the ratio is 1:3, 1:4, 1:5 or the like. Any suitable ratio may be used.

In addition, memory attributes may also include wear-out characteristics and volatility characteristics. As stated above, in one embodiment, the client, such as an operating system, does not explicitly manage the wear out properties of lossy devices that may change through time and vary substantially between process generations. As stated above, the non-volatile memory module 710 may include a logical-to-physical translation layer 718 that allows wear leveling, redundancy, ECC, and other features. This logical-to-physical translation layer 718 allows a reliable, non-lossy interface to be provided on top of an inherently lossy medium. However, in one embodiment, the non-volatile memory modules 710 do not manage this lossy nature in isolation. Specifically, in one embodiment, the non-volatile memory modules 710 may provide wear-out characteristics or other memory characteristics as part of a wear-out rate feedback mechanism to the client 802 so that it can make intelligent decisions about what write-level to drive into the memory modules 906, 910. For example, a non-volatile memory module 710 may export, by way of the control path 708, projected wear-out durations for predetermined time periods such as the 5 min, 60 min, 24 hour, and 7 day average traffic patterns. If a wear-out duration of 3 years is deemed to be too low, the client 802 may dynamically shift its write pattern (through page migration) to a more write-friendly device, such as a volatile memory module 906. If the wear-out duration of 10 years is deemed high enough, the client 802 may chose to dynamically shift more pages to the non-volatile memory module 906 to improve overall system energy efficiency.

Conventional non-volatile memory research focuses on the use of non-volatile memory module 906 as pin compatible solutions with JEDEC conforming devices. Conventional non-volatile memory research avoids non-volatile memory technologies such as Flash based technologies (NAND/NOR) because other memory researchers are unable to compensate for the wear-out properties of these devices.

The combination of non-volatile memory modules 710 and volatile memory modules 906 in a single system 900 as described above embraces the heterogeneous nature of new technology. Allowing new interfaces and devices to connect to the memory controller exports a richer set of interface properties and uses low power high density non-volatile memory when possible. The interplay between page migration, copy-on-write semantics, and application throughput may be leveraged to obtain the optimal power efficiency in systems while still maintaining a lower bound on application throughput.

Figure 10A:
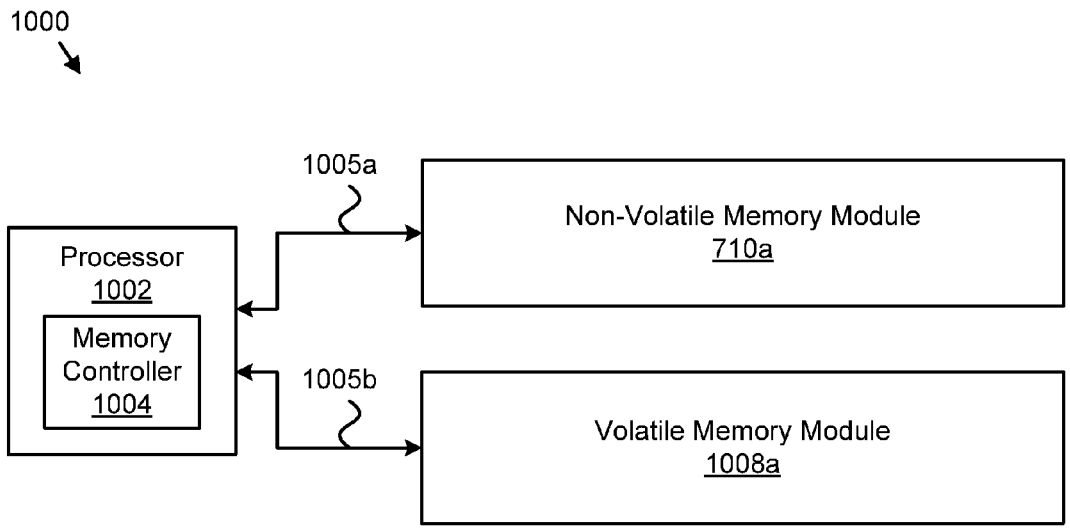
FIG. 10A is a schematic block diagram illustrating one embodiment of a system with a memory controller communicating with a plurality of memory modules in accordance with the present invention.

FIG. 10A illustrates one embodiment of a system 1000 with a memory controller 1004 communicating with a plurality of memory modules 710, 1008 in accordance with the present invention. Specifically, in one embodiment, a single memory controller 1004 may support two or more communication protocols. The depicted embodiment depicts a processor 1002 and a memory controller 1004 communicating with a non-volatile memory module 710a over a first interface 1005a and communicating with a volatile memory module 1008a over a second interface 1005b. In one embodiment, the memory controller 1004 communicates with the non-volatile memory with a first protocol and communicates with the volatile memory with a second protocol. In one embodiment, the first protocol and the second protocol are different protocols. For example, the first protocol may be the command protocol 806 described above and the second protocol may be the JEDEC protocol. In one embodiment, the memory controller 1004 includes multiple logic engines (to support multiple protocols) or a logic engine configured to support multiple protocols. The memory controller 1004 may exist in a system of multiple memory controllers and memory modules as described above in relation to FIG. 9.

Figure 10B:
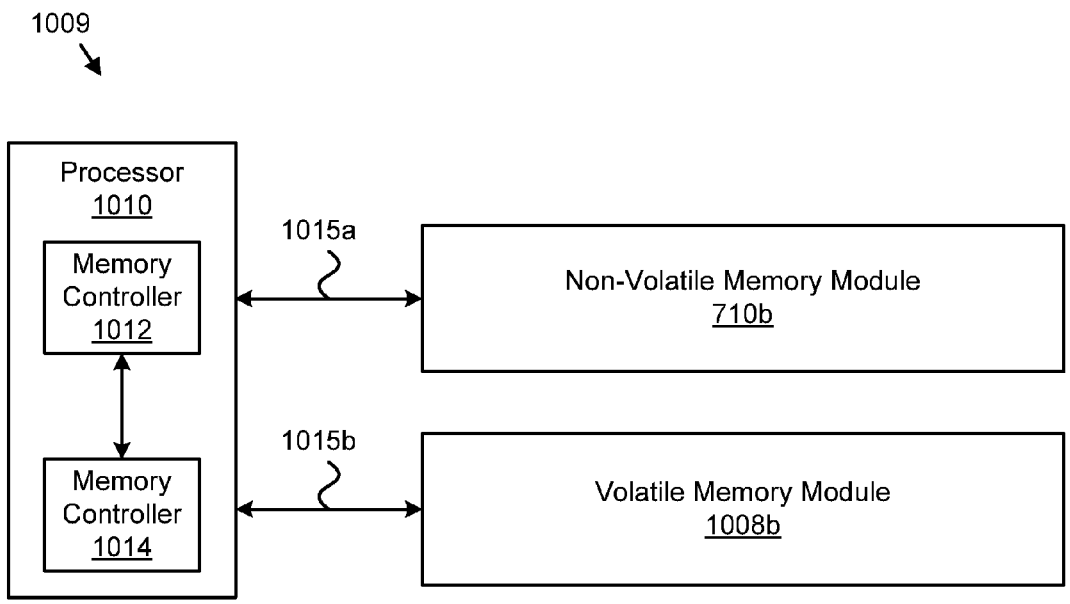
FIG. 10B is a schematic block diagram illustrating one embodiment of a system with a plurality of memory controllers in a processor communicating with a plurality of memory modules in accordance with the present invention.

FIG. 10B illustrates one embodiment of a system 1009 with a plurality of memory controllers 1012 in a processor communicating with a plurality of memory modules 710b, 1008b in accordance with the present invention. In the depicted embodiment, a first memory controller 1012 and a second memory controller 1014 are coupled to a common processor 1010. Specifically, a computing system supporting the depicted embodiment may allow multiple memory controllers 1012 per processor socket. The depicted embodiment shows the first memory controller 1012 communicating with a non-volatile memory module 710b over a first interface 1015a and the second memory controller 1014 communicating with a volatile memory module 1008b over a second interface 1015b. In one embodiment, the first memory controller 1012 communicates with the non-volatile memory with a first protocol and the second memory controller communicates with the volatile memory with a second protocol. In one embodiment, the first protocol and the second protocol are different protocols. For example, the first protocol may be the command protocol described above and the second protocol may be the JEDEC protocol.

In one embodiment, the client 802 may extend the NUMA factor from multi-socket to multi-memory controller even within a socket. In one embodiment, a computing system with non-volatile memory modules and multi-memory controller sockets may provide a lower NUMA factor than a widely distributed DRAM based system because the bit density of the non-volatile memory system can provide hundreds of GB of main memory within a power and space budget that is over 100× better. This results in decreased wire delays, a dominant portion of access time in modern NUMA systems. NUMA factors may no longer be tied to physical locality of memory controllers, so process scheduling due to the NUMA factor may be taken into account making memory controller utilization a first class scheduling primitive.

Figure 11:
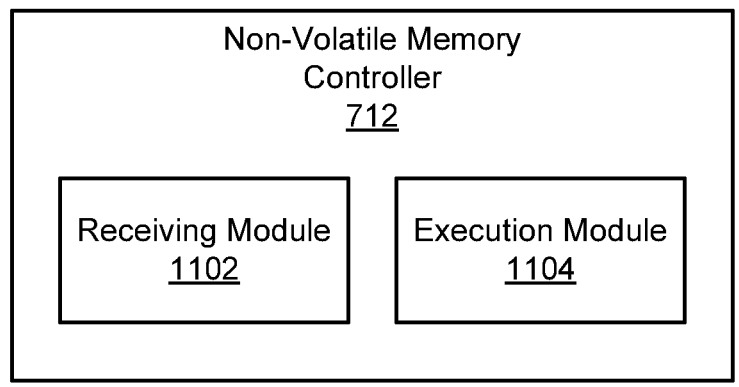
FIG. 11 is a schematic block diagram illustrating one embodiment of a non-volatile memory controller in accordance with the present invention.

FIG. 11 is a schematic block diagram illustrating one embodiment of the non-volatile memory controller 712. In the depicted embodiment, the non-volatile memory controller 712 includes a receiving module 1102 and an execution module 1104.

The receiving module 1102 receives commands from the memory controller 605 over the wire interface 707 by way of the command protocol as described above. The command protocol includes a control path 708 that enables the memory controller 605 to distinguish among different memory modules. Specifically, the memory controller 605 may obtain memory attributes from various memory modules 710 over the control path 708. The control path 708 also provides for more commands than a standard JEDEC protocol.

In one embodiment, commands received from the memory controller 605 may include read commands, write commands, or memory management commands. Memory management commands may be further classified as query commands, directive commands, hint commands, or checkpoint commands, which are described below.

In one embodiment, a hint command is a deallocation command or discard command identifying to the non-volatile memory controller 712 one or more memory units that have been deallocated, and thus no longer need to be preserved.

A hint command may also include an "F-advise" command. An application executing on the processor 602 may signal that it will be using a certain memory address range heavily. The memory controller 605 may issue an F-advise command notifying the non-volatile memory controller 712 to keep memory associated with the certain address range on the non-volatile memory media 718, in one embodiment, and to keep context metadata, such as forward mapping metadata as described below, for that memory address range in the volatile memory buffer 720 for ready access. In one embodiment, the non-volatile memory controller 712 may send an acknowledgment after receiving a hint command and/or executing the hint command.

A directive command may also identify to the non-volatile storage controller 712 one or more memory units for deallocation. However, in one embodiment, the directive may require the non-volatile storage controller 712 to erase the non-volatile storage media comprising the memory units and/or destroy data of the memory units such that the data is unusable. In one embodiment, the non-volatile storage controller 712 returns an acknowledgment in response to executing the directive command.

A query command, in one embodiment, queries the non-volatile memory controller 712 for memory attributes including characteristics of the non-volatile memory media 718 and/or information such as how much memory capacity is available, latency information, error correcting code ("ECC") latency, endurance information, status information, throttle rights (how much bandwidth, power, and the like is allocated to certain non-volatile memory modules 710) and the like. A checkpoint command may also be a type of directive or hint command that causes the checkpoint module 1214 to associate checkpoint information with the data on the non-volatile memory media 718 as described below.

The execution module 1104 executes a command within the non-volatile memory controller 712. In one embodiment, the execution module 1104 executes the command in response to the receiving module receiving the command. In another embodiment, the execution module 1104 determines whether the non-volatile memory controller 712 is capable of satisfying the command. In some embodiments, the non-volatile memory controller 712 may not be capable if memory allocation is above a certain level and/or if the non-volatile memory controller 712 needs to perform storage space recovery, if too many solid-state storage memory cells have worn out and are now unusable, and/or the like. The execution module 1104 executes the command in response to determining that the non-volatile memory controller 712 is capable of satisfying the command. As described below, if the execution module 1104 determines that the non-volatile memory controller 712 is incapable of executing the command, the execution module 1104 may trigger a signal to the memory controller 605 indicating such.

In one embodiment, the command received by the non-volatile memory controller 712 is a synchronous command, however the execution module 1104 may determine that the non-volatile memory controller 712 may need to execute the command asynchronously (for example to allow time for some memory space recovery such as garbage collection). The execution module 1104 may then execute the command asynchronously in response to determining that the memory controller 605 will accept satisfying the command asynchronously. For example, the non-volatile memory controller 712 may be able to execute the command asynchronously if the memory controller 605 can tolerate allowing time to perform storage space recovery, ECC correction, LEB retirement, and/or the like.

Executing the command may include reading data in response to a read command, writing data in response to a write command, and performing a memory management function or returning memory attributes in response to a memory management command.

Figure 12:
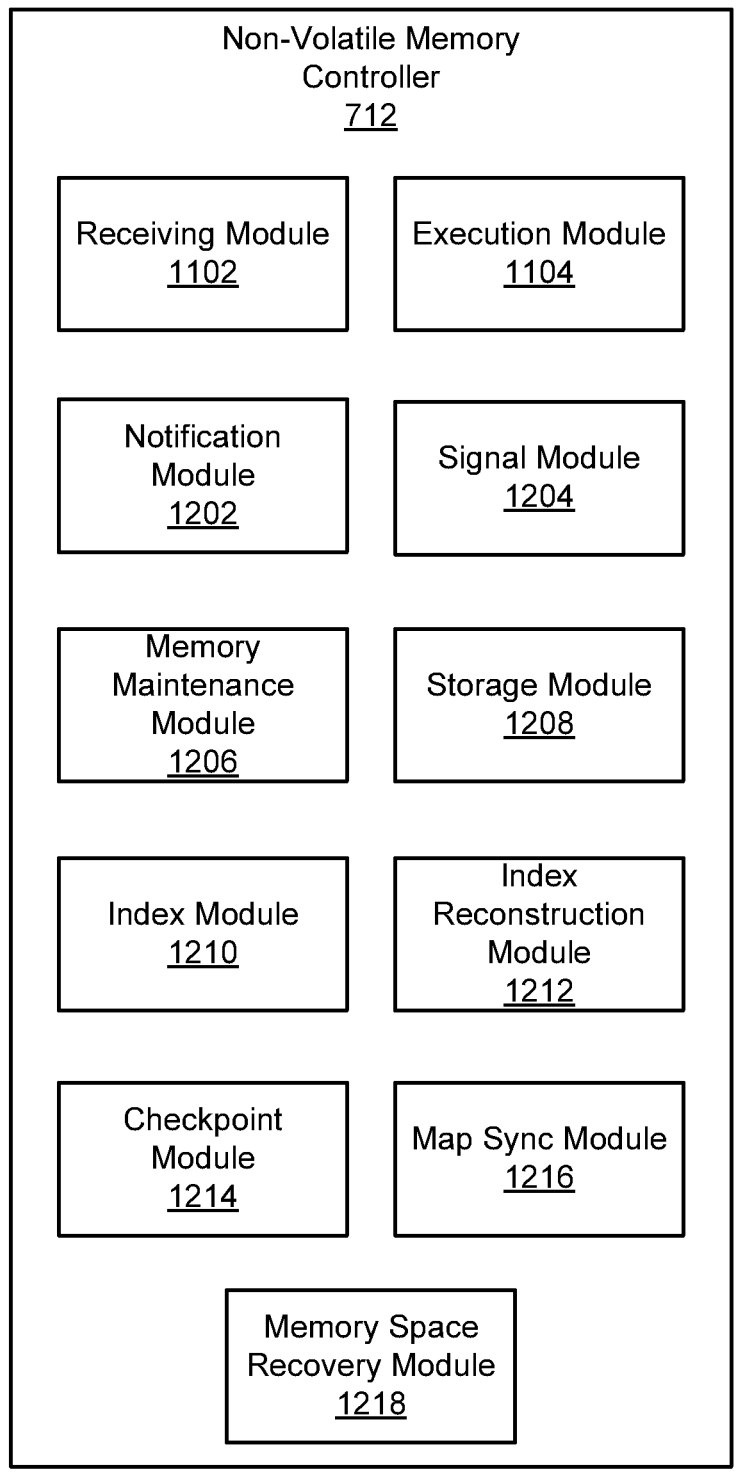
FIG. 12 is a schematic block diagram illustrating another embodiment of a non-volatile memory controller in accordance with the present invention.

FIG. 12 depicts another embodiment of the non-volatile memory controller 712 including the receiving module 1102 and the execution module 1104, and further including a notification module 1202, a signal module 1204, a memory maintenance module 1206, a storage module 1208, an index module 1210, an index reconstruction module 1212, a checkpoint module 1214, a map sync module 1216, and a memory space recovery module 1218.

The notification module 1202 notifies the memory controller 605 of memory attributes of the non-volatile memory, thus allowing the memory controller 605 to distinguish among different memory modules 710, 1008. These attributes may include, but are not limited to performance attributes, memory wear-out attributes, and quality of service attributes. writing frequency, reading frequency, power use characteristics, performance, persistence characteristics, volatility characteristics, wear-out characteristics, and the like. Instead of memory with assumed characteristics (and in fact characteristics that are implicitly required due to a communication protocol such as JEDEC), the memory controller 605 may obtain attributes of different memory modules 710, 1008 with which it communicates. In one embodiment, the memory controller 605 directs data to specific types of memory modules (volatile or non-volatile, single-level cell ("SLC") or multi-level cell ("MLC"), Phase Change Memory (PCM), Resistive Random-access Memory (RRAM), modules comprising a combination of non-volatile memory types, and the like) and/or specific memory divisions (such as physical pages, logical pages, physical erase blocks, logical erase blocks or the like) on the non-volatile memory media and/or the volatile memory media based on the memory attributes. In one embodiment, the notification module 1202 communicates memory attributes to the memory controller 605 over the control path 708 in response to a memory management command.

The signal module 1204 signals to the memory controller 605, using the command protocol, that a command will not be executed in response to the execution module 1104 determining that the non-volatile memory controller 712 is not capable of satisfying the command. As described above, if the non-volatile memory controller 712 is, for some reason, incapable of executing a command, the signal module 1204 may signal to the memory controller 605 that the command will not be executed. Consequently, the memory controller 605 may request execution of the command on another memory module. However, the command may be a read command for data located on the non-volatile memory media 718 of the non-volatile memory controller 712 that received the command. In such an embodiment, the memory controller 605 may have to wait until the non-volatile memory controller 712 can service the read command. In another embodiment, the signal module 1204 signals to the memory controller 605 indicating that the execution module 1104 can execute the command asynchronously rather than synchronously. If the memory controller 712 indicates that asynchronous execution is acceptable (e.g. such as through a command on the control path 708) the execution module 1104 may execute the command asynchronously. Of course in other embodiments, the initial synchronous command from the memory controller 712 may include and indicator that asynchronous execution is permissible.

The memory maintenance module 1206 operates and/or triggers one or more memory maintenance functions for the non-volatile memory module 710 to optimize non-volatile memory performance. Memory maintenance functions may include but are not limited to storage space recovery, power management, thermal management, scanning (evaluating sections of the non-volatile memory media 718 such as physical pages, logical pages, physical erase blocks, logical erase blocks or the like to determine if they should be retired), wear-leveling, defragmentation, and the like. The memory maintenance module 1206 may perform memory maintenance independent of the memory controller 605. For example, the memory maintenance module 1206 may perform memory maintenance functions in response to detecting available free memory media 718 falling below a predetermined threshold.

In one embodiment, the memory maintenance module 1206 receives memory management commands from the memory controller 605 (e.g. through the control path 708) instructing the memory maintenance module 1206 to operate and/or trigger memory maintenance functions. For example, the processor 602, an application, host, or the like may detect a period of time in which the processor 602 will not be sending commands to the non-volatile memory controller 712 (e.g. the user sets the host computer into a sleep mode) and may instruct the memory maintenance module 1206 to perform one or more memory maintenance functions during the period.

The storage module 1208 stores data on the non-volatile memory media 718. In one embodiment, the storage module 1208, stores data sequentially on the non-volatile memory media 718 to preserve an ordered sequence of memory operations performed on the non-volatile memory media 718. Likewise, in one embodiment, the storage module 1208 associates sequence indicators with the data on the non-volatile memory media 718, wherein the sequence indicators determine an ordered sequence of memory operations performed on the non-volatile memory media 718.

For example, the storage module 1208 may store the data of memory operations to the non-volatile memory media 718 sequentially by appending the data to an append point of a sequential, log-based, cyclic writing structure of the non-volatile memory media 718, in the order that the receiving module receives the commands. The log-based structure may optionally record indicators of various commands (e.g. read commands, write commands, memory management commands) received by the receiving module 1102. For example, the log may include a record that the receiving module 1102 received a memory management command at a certain order and point in time with respect to other commands. In another embodiment, the organization of the log-based, cyclic writing structure implicitly captures the order of certain memory operations. For example, if the log writes data in a predetermined order, and the non-volatile memory media 718 is a write-out-of place media, then blocks of data for a common logical memory address occurring multiple times in the log indicate multiple write operations for that logical memory address and the last time data for this logical memory address was written will be the most current version of the data.

Likewise, in one embodiment, the storage module 1208 stores data in a format that associates the data with respective logical memory addresses on the non-volatile memory media 718. Specifically, the storage module 1208 may store the respective logical memory addresses of the data on the non-volatile memory media 718 in association with the corresponding data on the log-based writing structure. For example, the storage module 1208 may store a logical memory address in metadata space or in a packet header with the data. The storage module 1208 may also store a numerical sequence indicator as metadata with data of a command, may use the sequential order of a log-based writing structure as a sequence indicator, or the like. By storing sequence indicators and logical memory addresses of data with the data on the non-volatile memory media 718, the storage module 1208 enables the index reconstruction module 1212 (described below) to reconstruct, rebuild, and/or recover entries in a mapping structure using the stored sequence indicators and logical memory addresses.

The index module 1210 maintains an index of associations between logical memory addresses of the data and physical storage memory locations comprising the data on the non-volatile memory media 718. In one embodiment, the index module 1210 maps logical memory addresses (e.g. memory addresses from the memory controller 605) to actual physical addresses and/or locations on the non-volatile memory media 718 using the index. In a further embodiment, the index module 1210 uses a single mapping structure as the index to map logical memory addresses of the memory controller 605 to physical addresses specifying actual locations on the non-volatile memory media 718.

The index, in various embodiments, may include a B-tree, B*-tree, B+-tree, a CAM, a binary tree, a hash table, an index, an array, a linked-list, a look-up table, or another mapping data structure. Use of a B-tree as the index in certain embodiments, is particularly advantageous where the logical address space presented to the memory controller 605 is a very large address space ($2^{64}$ addressable blocks—which may or may not be sparsely populated). Because B-trees maintain an ordered structure, searching such a large space remains very fast. For example, in one embodiment, the index includes a B-tree with multiple nodes and each node may store several entries. In the example embodiment, each entry may map a variable sized range or ranges of logical memory addresses to a location on the non-volatile memory media 718. Furthermore, the number of nodes in the B-tree may vary as the B-tree grows wider and/or deeper.

In one embodiment, the index of the index module 1210 only includes a node or entry for logical memory addresses that are associated with currently stored data in the non-volatile memory media 718. In this embodiment, membership in the index represents membership in/presence on the non-volatile memory media 718. The index module 1210, in one embodiment, adds entries, nodes, and the like to the index as data is stored on the non-volatile memory media 718 and removes entries, nodes, and the like from the index in response to data being cleared, trimmed, or otherwise deallocated from memory. Similarly, membership in the index may represent valid allocated memory units (such as data pages) on the non-volatile memory media 718. The storage module 1208, in one embodiment, adds entries, nodes, and the like to the index as data is stored on the non-volatile memory media 718 and removes entries, nodes, and the like from the index in response to data being invalidated cleared, trimmed, or otherwise removed from the non-volatile memory media 718.

The non-volatile memory module 710 may include a volatile memory buffer 720. In one embodiment, the index module 1210 stores the index in this volatile memory 720. The index module 1210, in one embodiment, stores at least one copy of some or all of the mapping structure to the non-volatile memory media 718 periodically. By storing the index on the non-volatile memory media 718, in a further embodiment, the mapping of logical memory addresses of the memory controller 605 to the locations on the non-volatile memory media 718 is persisted, even if the non-volatile memory module 710 undergoes an unexpected or improper shutdown, power loss, or the like. The volatile memory buffer 720 may comprise dynamic random access memory ("DRAM"), static random access memory ("SRAM"), buffer random access memory ("BRAM"), or other suitable volatile memory.

In one embodiment, the index module 1210 uses the index to identify one or more physical addresses of data of a data segment. The physical addresses are identified from one or more logical memory addresses of the data segment, which are identified in commands directed to the non-volatile memory media 718 from the memory controller 605.

The logical memory addresses correspond to one or more data segments relating to the data stored in the non-volatile memory media 718. The one or more logical memory addresses typically include discrete addresses within a logical memory address space where the logical memory addresses sparsely populate the logical memory address space.

Often logical memory addresses used to identify stored data represent a very small number of logical memory addresses that are possible within a name space or range of possible logical memory addresses. Searching this sparsely populated space may be cumbersome. For this reason, the index is typically a data structure that facilitates quickly traversing the index to find a physical address based on a logical memory address. For example, the index may include a B-tree, a content addressable memory ("CAM"), a binary tree, a hash table, or other data structure that facilitates quickly searching a sparsely populated space or range.

While the index may be optimized, or at least designed, for quickly determining a physical address from a logical memory address, typically the index is not optimized for locating all of the data within a specific region of the non-volatile memory media 718. For this reason, the index module 1210 may include a reverse map to determine a logical memory address of a data segment from a physical address. The reverse map is used to map the one or more physical addresses to one or more logical memory addresses and can be used by the index module 1210 or other process to determine a logical memory address from a physical address. The reverse map beneficially maps the non-volatile memory media 718 into erase regions such that a portion of the reverse map spans an erase region of the non-volatile memory media 718 erased together during a memory space recovery operation. The memory space recovery operation (or garbage collection operation) recovers erase regions for future storage of data. By organizing the reverse map by erase region, the memory space recovery module described below can efficiently identify an erase region for memory space recovery and identify valid data.

The index reconstruction module 1212 reconstructs the index using the logical memory addresses and the sequence indicators associated with the data on the non-volatile memory media 718. In one embodiment, reconstructing the index includes replaying a sequence of changes made to the index using the logical memory addresses and the sequence indicators associated with the data on the non-volatile memory media 718.

The index reconstruction module 1212, in one embodiment, reconstructs the index and included entries by scanning data on the non-volatile memory media 718, such as a sequential log-based writing structure or the like, and extracting logical memory addresses, sequence indicators, and the like from data at physical locations on the non-volatile memory media 718. For example, as described above, in certain embodiments the storage module 1208 stores data of commands in a format that associates the data with sequence indicators for the data and with respective logical memory addresses for the data. If the index becomes lost or corrupted, the index module 1210 may use the physical address or location of data on the non-volatile memory media 718 with the associated sequence indicators, logical memory addresses, and/or other metadata stored with the data, to reconstruct entries of the index.

Where data is stored on the non-volatile memory media 718 sequentially, by keeping track of the order in which erase regions in the non-volatile memory media 718 were filled and by storing logical memory addresses with the data, the non-volatile memory media 718 becomes a sequential log. The index reconstruction module 1212 replays the log by sequentially reading data packets stored on the non-volatile memory media 718. Each physical address and a data packet length of associated data is paired with the logical memory address found in each data packet to recreate the forward and reverse maps.

In one embodiment, reconstructing the index includes rolling back a sequence of changes made to the index from a last change back to a valid checkpoint indicator using the logical memory addresses and the sequence indicators associated with the data on the non-volatile memory media 718.

The checkpoint module 1214 associates checkpoint information with the data on the non-volatile memory media 718. This checkpoint information determines an ordered sequence of memory checkpoint operations performed on the non-volatile memory media 718 and includes, in some embodiments, a copy of the index or a portion of the index stored onto the non-volatile memory media 718 from the volatile memory buffer 720. The checkpoint module 1214 may store information, such as the index or portions of the index and the reverse map, where the checkpoint is related to a point in time or state of the non-volatile memory module (e.g. a stable state that the map sync module 1216 may roll back to as described below). The stored checkpoint information is sufficient to restore the index and the reverse map to a consistent and stable state without having to replay the entire log from the beginning. For example, the stored information may include storing the index and reverse maps in non-volatile storage, such as on the non-volatile storage media 718, along with some identifier indicating a state or time checkpoint. Checkpoint information, in one embodiment, is stored in the log itself at the checkpoint. In one embodiment, the checkpoint module 1214 creates a checkpoint in response to the receiving module 1102 receiving a memory management checkpoint command.

In one embodiment, the map sync module 1216 updates the index and the reverse map by replaying the log from the checkpoint, using the checkpoint information as a base. The replaying of the log updates the index mappings to reflect memory operations that occurred since the checkpoint. Beneficially the map sync module 1216 restores the index and reverse map from a checkpoint up to a current state, rather than starting from scratch and replaying the entire contents of the non-volatile memory media 718. The map sync module 1216 uses the checkpoint to go to a data packet stored just after the checkpoint and then replays data packets from that point to a last current stable state of the non-volatile memory media 718. The map sync module 1216 typically takes less time to restore the forward and reverse maps than the index reconstruction module 1212.

The memory space recovery module 1218 recovers memory capacity of non-volatile memory media 718 corresponding to data that is marked as invalid. In one embodiment, the memory space recovery module 1218 recovers memory capacity of non-volatile memory media 718 corresponding to invalid data opportunistically. For example, the memory space recovery module 1218 may recover memory capacity in response to a lack of available memory capacity, a percentage of data marked as invalid reaching a predefined threshold level, a consolidation of valid data, an error detection rate for a section of non-volatile memory media 718 reaching a threshold value, performance crossing a threshold value, a scheduled garbage collection cycle, identifying a section of the non-volatile memory media 718 with a high amount of invalid data, identifying a section of the non-volatile memory media 718 with a low amount of wear, or the like.

In one embodiment, the memory space recovery module 1218 relocates valid data that is in a section of the non-volatile memory media 718 that the memory space recovery module 1218 is recovering to preserve the valid data. In one embodiment, the memory space recovery module 1218 is part of an autonomous garbage collector system that operates within the non-volatile memory module 710. This allows the non-volatile memory module 710 to manage data so that data is systematically spread throughout the non-volatile memory media 718, or other physical memory media, to improve performance, data reliability and to avoid overuse and underuse of any one location or area of the non-volatile memory media 718 and to lengthen the useful life of the non-volatile memory media 718.

The memory space recovery module 1218, upon recovering a section of the non-volatile memory media 718, allows the non-volatile memory controller 712 to re-use the section of the non-volatile memory media 718 to store different data. In one embodiment, the memory space recovery module 1218 adds the recovered section of non-volatile memory media 718 to an available storage pool. The memory space recovery module 1218, in one embodiment, erases existing data in a recovered section. In a further embodiment, the memory space recovery module 1218 allows the non-volatile memory controller 712 to overwrite existing data in a recovered section, where the non-volatile memory media allows overwriting existing data at the same location, without first requiring an erase operation.

In one embodiment, the memory space recovery module 1218 uses the reverse map to identify valid data in an erase region prior to an operation to recover the erase region. The identified valid data is moved to another erase region prior to the recovery operation. By organizing the reverse map by erase region, the memory space recovery module 1218 can scan through a portion of the reverse map corresponding to an erase region to quickly identify valid data or to determine a quantity of valid data in the erase region. An erase region may include an erase block, a fixed number of pages, etc. erased together. The reverse map may be organized so that once the entries for a particular erase region are scanned, the contents of the erase region are known.

By organizing the reverse map by erase region, searching the contents of an erase region is more efficient than searching a B-tree, binary tree, or other similar structure used for logical-to-physical address searches. Searching forward map in the form of a B-tree, binary tree, etc. is cumbersome because the B-tree, binary tree, etc. would frequently have to be searched in its entirety to identify all of the valid data of the erase region. The reverse may include a table, data base, or other structure that allows entries for data of an erase region to be stored together to facilitate operations on data of an erase region.

Figure 13:
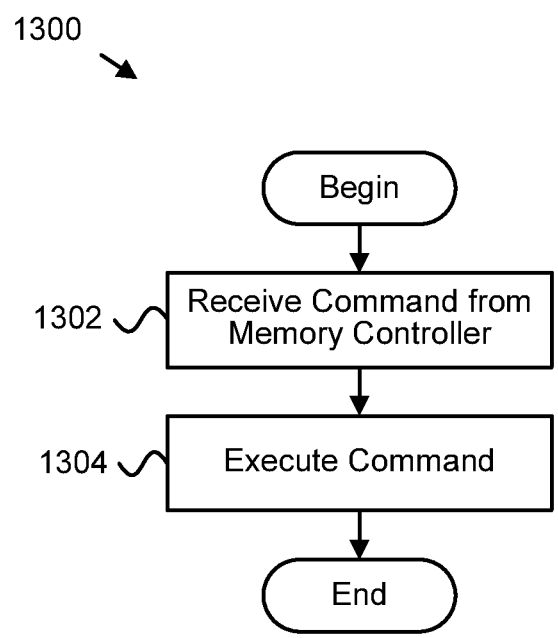
FIG. 13 is a schematic flow chart diagram illustrating one embodiment of a method for a direct interface between a memory controller and a non-volatile memory controller using a command protocol in accordance with the present invention.

FIG. 13 depicts one embodiment of a method 1300 for a direct interface between a memory controller 605 and a non-volatile memory controller 712 using a command protocol. The method 1300 begins and the receiving module 1102 receives 1302 a command from the memory controller 605. The command may be a read command, a write command, or a memory management command. Next, the execution module 1104 executes 1304 the command within the non-volatile memory controller 712 in response to determining that the non-volatile memory controller 712 is capable of satisfying the command. Then, the method 1300 ends.

Figure 14:
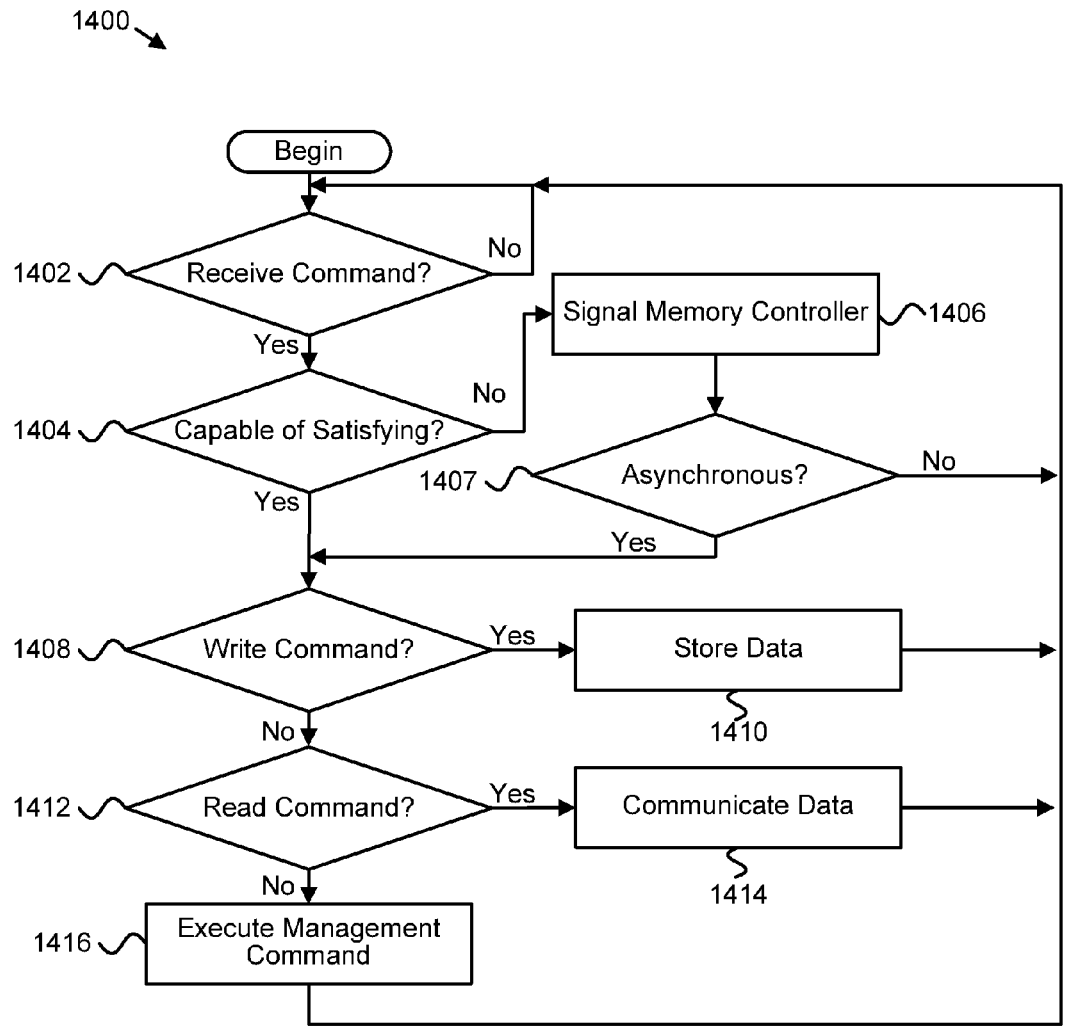
FIG. 14 is a schematic flow chart diagram illustrating another embodiment of a method for a direct interface between a memory controller and a non-volatile memory controller using a command protocol in accordance with the present invention.

FIG. 14 depicts one embodiment of a method 1400 for a direct interface between a memory controller 605 and a non-volatile memory controller 712 using a command protocol. The method 1400 begins and the receiving module 1102 awaits 1402 commands from the memory controller 605. When the receiving module 1102 receives a command, in one embodiment, the execution module 1104 determines 1404 whether the non-volatile memory controller 712 is capable of satisfying the command (e.g the non-volatile memory controller 712 has sufficient resources, and the like). If the execution module 1104 determines 1404 that the non-volatile memory controller 712 is incapable of satisfying the command, the signal module 1204 signals 1406 the memory controller 605 informing the memory controller 605 that this particular non-volatile storage module 710 cannot execute the command and/or informing the memory controller 605 that the non-volatile storage module 710 may execute the command asynchronously.

If the execution module 1104 determines 1404 that the non-volatile memory controller 712 is capable of satisfying the command or if the receiving module 1102 receives 1407 an indication that asynchronous execution of the command is acceptable, the execution module 1104 executes the command. Specifically, if the command is a write command 1408, the execution module 1104 signals the non-volatile memory controller 712 to store data associated with the command. The data is received by the non-volatile memory controller 712 over the data path 706. If the command is a read command 1412, the execution module 1104 signals the non-volatile memory controller 712 to read data requested by the command. Otherwise, if the command is a management command 1416, the execution module 1104 signals the non-volatile memory controller 712 to return memory attributes, perform memory maintenance functions, perform a trim, and/or other functions depending on the type of memory management command over the control path 708. The receiving module 1102 continues to monitor for commands from the memory controller 605.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for an interface between a memory controller and a non-volatile memory controller using a command protocol, the method comprising:
   receiving a command from a memory controller to a non-volatile memory controller over a wire interface by way of a command protocol, the memory controller coupled to one or more processors, the non-volatile memory controller coupled to non-volatile memory media, the wire interface comprising a control path for the command protocol, the control path enabling the memory controller to distinguish among different memory modules, the command protocol configured to support one or more commands that are not supported by a standard volatile memory interface; and
   executing the command within the non-volatile memory controller in response to determining that the non-volatile memory controller is capable of satisfying the command.

2. The method of claim 1, wherein the command received comprises a synchronous command and further comprising executing the command asynchronously in response to determining that the non-volatile memory controller is capable of satisfying the command asynchronously.

3. The method of claim 1, further comprising signaling to the memory controller, using the command protocol, that the command will not be executed in response to determining that the non-volatile memory controller is not capable of satisfying the command.

4. The method of claim 1, wherein the memory controller communicates with volatile memory by way of a second protocol, the command protocol and the second protocol comprising different protocols.

5. The method of claim 4, further comprising notifying the memory controller of memory attributes of the non-volatile memory, the memory controller directing data to one of the non-volatile memory, the volatile memory, a memory division on the non-volatile memory, and a memory division on the volatile memory based on the memory attributes.

6. The method of claim 1, wherein a second memory controller communicates with volatile memory by way of a second protocol, the second memory controller coupled to one or more processors, the command protocol and the second protocol comprising different protocols.

7. The method of claim 6, wherein the second memory controller is coupled to a second processor and the second processor is coupled to the processor such that memory accessible to the second memory controller is accessible to the processor and the second processor and memory accessible to the memory controller is accessible to the processor and the second processor.

8. The method of claim 1, further comprising associating sequence indicators with data on the non-volatile memory media, wherein the sequence indicators determine an ordered sequence of memory operations performed on the non-volatile memory media.

9. The method of claim 1, further comprising associating checkpoint information with data on the non-volatile memory media, wherein the checkpoint information is organized in an ordered sequence of memory checkpoint operations performed on the non-volatile memory media.

10. The method of claim 1, further comprising:
   storing data in a format that associates the data with respective logical memory addresses on the non-volatile memory media;
   maintaining an index of associations between logical memory addresses of the data and physical storage memory locations comprising the data on the non-volatile memory media; and
   reconstructing the index using the logical memory addresses and sequence indicators associated with the data on the non-volatile memory media, wherein reconstructing the index comprises replaying a sequence of changes made to the index using the logical memory addresses and the sequence indicators associated with the data on the non-volatile memory media.

11. The method of claim 10, wherein reconstructing the index comprises rolling back a sequence of changes made to the index from a last change back to a valid checkpoint indicator using the logical memory addresses and the sequence indicators associated with the data on the non-volatile memory media.

12. The method of claim 1, wherein the command comprises one of a read command, a write command, and a memory management command, the memory management command comprising one or more of a query command, a directive command, and a hint command.

13. The method of claim 1, further comprising operating one or more memory maintenance functions on the non-volatile memory to optimize non-volatile memory performance, wherein the non-volatile memory controller operates the one or more memory maintenance functions according to one of independent of the memory controller and in response to receiving memory management commands from the memory controller.

14. An apparatus for an interface between a memory controller and a non-volatile memory controller using a command protocol, the apparatus comprising:
   a receiving module configured to receive a command from a memory controller to a non-volatile memory controller over a wire interface by way of a command protocol, the memory controller coupled to one or more processors, the non-volatile memory controller coupled to non-volatile memory media, the wire interface comprising a control path for the command protocol, the control path enabling the memory controller to distinguish among different memory modules based on memory attribute information received from the non-volatile memory controller using the control path; and
   an execution module configured to execute the command within the non-volatile memory controller in response to determining that the non-volatile memory controller is capable of satisfying the command.

15. The apparatus of claim 14, wherein the memory controller communicates with volatile memory by way of a second protocol, the command protocol and the second protocol comprising different protocols.

16. The apparatus of claim 15, further comprising a notification module configured to notify the memory controller of memory attributes of the non-volatile memory, the memory controller directing data to locations on one of the non-volatile memory and the volatile memory based on the memory attributes.

17. The apparatus of claim 14, further comprising a checkpoint module configured to associate checkpoint information with data on the non-volatile memory media, wherein the checkpoint information is organized in an ordered sequence of memory checkpoint operations performed on the non-volatile memory media.

18. The apparatus of claim 14, further comprising:
a storage module configured to store data in a format that associates the data with respective logical memory addresses on the non-volatile memory media;
an index module configured to maintain an index of associations between logical memory addresses of the data and physical storage locations comprising the data on the non-volatile memory media; and
an index reconstruction module configured to reconstruct the index using the logical memory addresses and sequence indicators associated with the data on the non-volatile memory media, wherein the index reconstruction module replays a sequence of changes made to the index using the logical memory addresses and the sequence indicators associated with the data on the non-volatile memory media.

19. The apparatus of claim 18, wherein the storage module is further configured to associate sequence indicators with the data on the non-volatile memory media, wherein the sequence indicators determine an ordered sequence of memory operations performed on the non-volatile memory media.

20. A system for an interface between a memory controller and a non-volatile memory controller using a command protocol, the system comprising:
one or more processors;
a memory controller coupled to the one or more processors, the memory controller configured to:
generate a command in response to a request from a client;
communicate the command over a wire interface by way of a command protocol, the wire interface comprising a control path for the command protocol, the control path enabling the memory controller to distinguish among different memory modules, the control path configured to communicate a memory management command of the command protocol between the memory controller and the non-volatile memory controller; and
a non-volatile memory controller coupled to non-volatile memory media, the non-volatile memory controller configured to:
receive the command from the memory controller; and
execute the command within the non-volatile memory controller in response to determining that the non-volatile memory controller is capable of satisfying the command.

* * * * *